United States Patent
Nishimoto et al.

(10) Patent No.: US 6,812,565 B2
(45) Date of Patent: Nov. 2, 2004

(54) SEMICONDUCTOR DEVICE AND A METHOD OF MANUFACTURING THE SAME

(75) Inventors: Kenji Nishimoto, Saitama (JP); Mitsuaki Katagiri, Nishitokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/322,432

(22) Filed: Dec. 19, 2002

(65) Prior Publication Data

US 2003/0128602 A1 Jul. 10, 2003

(30) Foreign Application Priority Data

Jan. 7, 2002 (JP) ........................................ 2002-000504

(51) Int. Cl.$^7$ .............................................. H01L 23/34
(52) U.S. Cl. ..................... 257/723; 257/724; 257/726; 257/778; 257/784
(58) Field of Search ............................... 257/723–724, 257/726, 778, 784

(56) References Cited

U.S. PATENT DOCUMENTS 6,388,318 B1 * 5/2002 Iwaya et al. ................ 257/723

FOREIGN PATENT DOCUMENTS

JP 9-293938 11/1997

OTHER PUBLICATIONS

Technical Research Association, May 28, 2000, "Electronics Loading Technique", pp. 81–113.

* cited by examiner

*Primary Examiner*—Luan Thai
(74) *Attorney, Agent, or Firm*—Mattingly, Stanger & Malur, P.C.

(57) ABSTRACT

There is provided a multi-chip module which can vary functions of a memory chip at the time of loading or after loading, to the wiring board, the memory chip having formed an external connecting terminal with the wafer process. Two kinds of multi-chip modules having different functions such as word configuration and operation mode is realized using the identical memory chips by preparing for two kinds of module substrate of different patterns of wiring including the power supply voltage wiring and the ground potential wiring and then loading a memory chip and a control chip to these two kinds of module substrate.

12 Claims, 32 Drawing Sheets

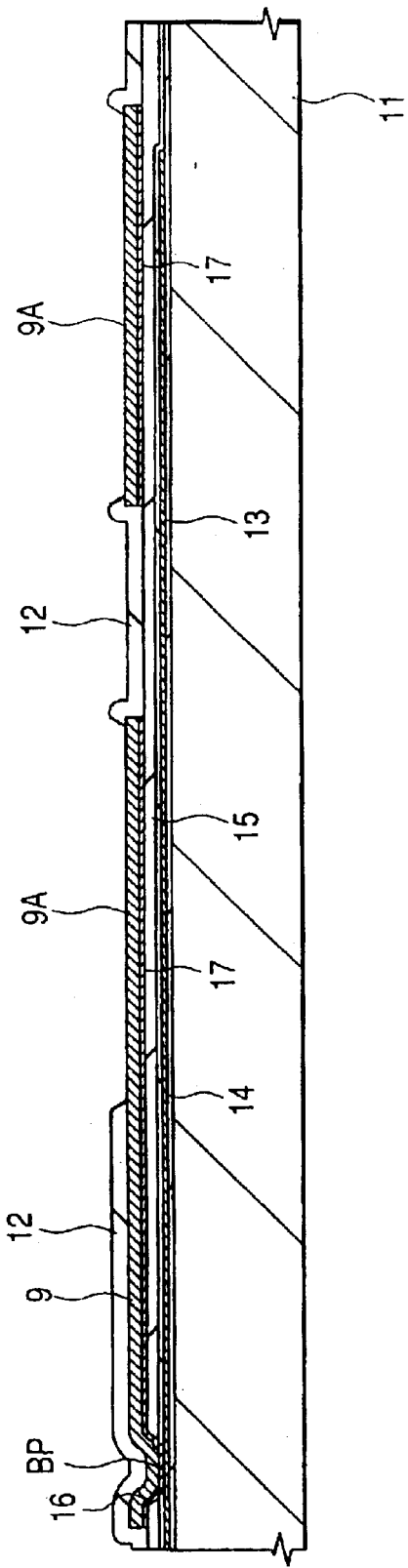
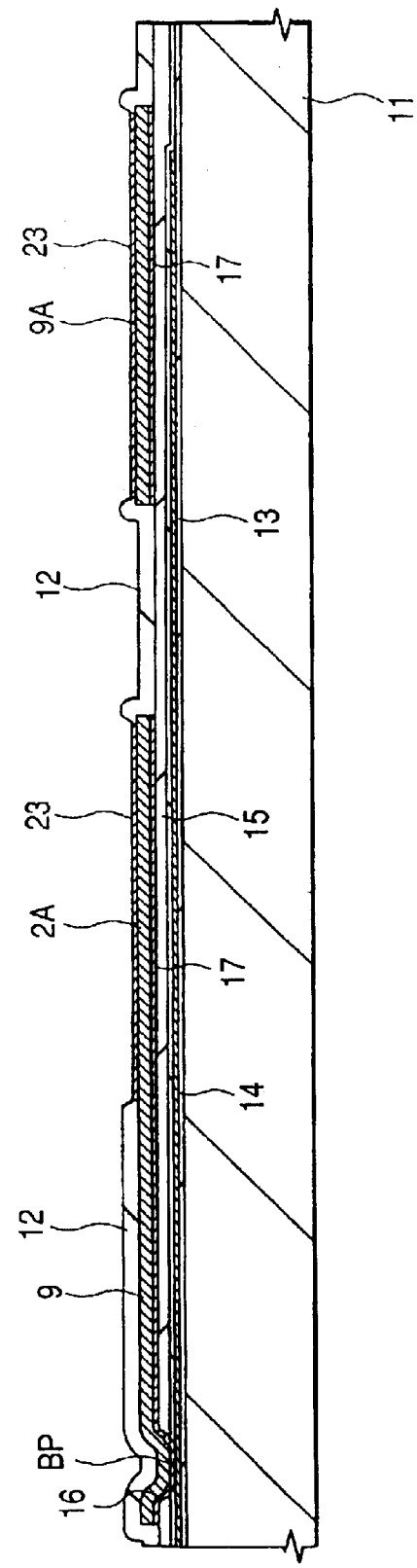

SEMICONDUCTOR DEVICE AND A METHOD OF MANUFACTURING THE SAME

BACKGROUND OF THE INVENTION

The present invention relates to a semiconductor device and a method of manufacturing the same and particularly to the technology which can be effectively applied to a multi-chip module in which a plurality of semiconductor chips including a memory chip are mounted on a wiring board.

In a manufacturing process of a multi-chip module in which a memory chip and a control chip for controlling operations of the memory chip are mounted on a wiring board, a bonding option for switching the functions of memory chip such as word configuration, operation mode and refresh cycle by changing the connecting pattern of wires on the occasion of loading a memory chip on the wiring board and then connecting these elements with wires is conducted. However, this bonding option system cannot change the functions after the memory chip is once mounted to the wiring board.

The Japanese unexamined patent publication No. Hei 9(1997)-293938 describes a memory module which can switch various functions such as refresh cycle, operation mode and word configuration on the wiring board. Switchover of these functions can be realized by inputting any signal (function switching signal) of the power supply voltage, ground potential and non-connect (open) signals to a bonding pad for switching the functions formed on a memory chip.

On the wiring board, a function switching means for freely switching the function switching signal explained above is provided and various functions of all memory chips mounted on the wiring board can be switched at a time by freely switching the function switching signal using the function switching means. The function switching means is composed of a plurality of lands formed on the wiring board and conductivity chips which can be mounted on these lands. The function switching signal is determined depending on whether the conductivity chip is mounted to the predetermined lands or not.

Meanwhile, the technology so-called wafer process package WPP or wafer level CSP are also known, in which the packaging process (post-process) is integrated with a wafer process (pre-process) and the processes up to the packaging process is completed under the wafer condition. In this technology, the packaging process is executed by application of the wafer process. Therefore, this technology provides advantages that the number of processes can be reduced and the package size can also be reduced in comparison with the prior art method in which the packaging process is conducted for each chip sliced from the wafer. This wafer process package is described in the "Electronics Loading Technique" Special Edition of 2000, PP 81 to 113, issued by Technical Research Association (May 28, 2000).

SUMMARY OF THE INVENTION

In the case of wafer process packaged explained above, since an external connecting terminal (solder bump) is formed with the wafer process, after the wafer is divided to chips, various functions of memory such as refresh cycle, operation mode and word configuration cannot be varied. Therefore, different kinds of memory chips must be prepared for each function, resulting in the disadvantage that wafer process and stock management of chips are complicated.

Moreover, it is sometime requested by user for the multi-chip module that memory functions is changed after the memory chip is mounted to the wiring board, but when a memory chip is the wafer process package, functions of memory cannot be varied after the memory chip is mounted on the wiring board.

It is therefore an object of the present invention to provide a multi-chip module which can vary the functions of memory chip at the time of loading a memory chip having formed an external connecting terminal with the wafer process to the wiring board.

Another object of the present invention is to provide a multi-chip module which can vary functions of memory chip after the memory chip having formed external connecting terminal with wafer process is mounted to the wiring board.

Another object of the present invention is to provide the technique for improving reliability of multi-chip module loading the memory chip having formed external connecting terminal with wafer process to the wiring board.

The aforementioned objects and other novel features of the present invention will become apparent from the description of the present specification and accompanying drawings.

The typical inventions disclosed in the present invention will be briefly explained below.

The semiconductor device of the present invention is a multi-chip module in which a plurality of semiconductor chips including memory chips are mounted on a wiring board, this memory chip comprises an integrated circuit including a plurality of memory elements, a plurality of electrodes electrically connected to the integrated circuit, an insulation layer which is formed covering the integrated circuit to expose a plurality of electrodes, a plurality of wires formed on the insulation layer and electrically connected respectively to a plurality of electrodes and a plurality of external connecting terminals formed on the insulation layer and electrically connected respectively to a plurality of wires, and a plurality of external connecting terminals include an external connecting terminal for switching the functions for switching the predetermined functions of the integrated circuit depending on a voltage level of the input signal and switching the predetermined function of the integrated circuit by supplying the signal of the predetermined voltage level to the external connecting terminal for switching the function of the memory chip through the wiring board.

Further, a method of manufacturing a semiconductor device comprises the steps of:

(a) preparing a plurality of memory chips, each memory chip including: an integrated circuit including a plurality of memory elements; a plurality of electrodes electrically connected to the integrated circuit; an insulation layer formed covering the integrated circuit and exposing the plurality of electrodes; a plurality of wirings formed at the upper part of the insulation film and electrically connected respectively with the plurality of electrodes; and a plurality of external connecting terminals including a function switching external connecting terminal formed at the upper part of the insulation film, electrically connected respectively to the plurality of wirings, and switching a function of the integrated circuit to the predetermined function depending on a voltage level of an input signal;

(b) preparing the first wiring board for supplying a signal of the first voltage level to the function switching external connecting terminal of the memory chip and the second wiring board for supplying a signal of the second voltage level to the function switching external connecting terminal of the memory chip; and (c) manufacturing a plurality of kinds of multi-chip modules having the different functions by loading a part of the plurality of memory chips to the first wiring board and then loading the other part thereof to the second wiring board.

Further, in the method, the first wiring board and the second wiring board are different from each other in the wiring pattern connected to the function switching external connecting terminal of the memory chip.

Further, the method comprises a step of loading, on the first wiring board, the first semiconductor chip for supplying the signal of the first voltage level to the function switching external connecting terminal of the memory chip and also loading, on the second wiring board, the second semiconductor chip for supplying the signal of the second voltage level to the function switching external connecting terminal of the memory chip.

Further, the method comprises a step of supplying the sealing resin respectively to a gap between the memory chip and the first wiring board and a gap between the memory chip and the second wiring board.

BRIEF DESCRIPTION OF THE DRAWINGS

FIG. 27 is a cross-sectional view of the essential portion illustrating the manufacturing method of the memory chip.

FIG. 28 is a cross-sectional view of the essential portion illustrating the manufacturing method of the memory chip.

DETAILED DESCRIPTION OF THE PREFERRED EMBODIMENTS

Figure 1A:
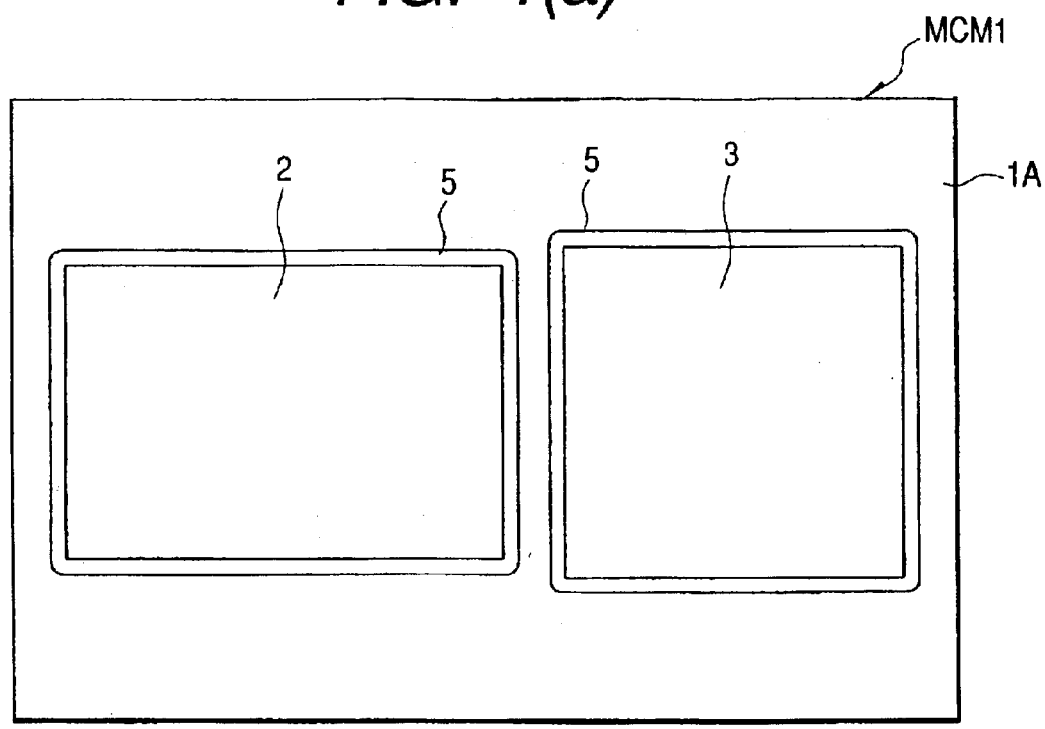
FIGS. 1(a), 1(b) are plan views illustrating the first multi-chip module as an embodiment of the present invention.

The preferred embodiments of the present invention will be explained in detail with reference to the accompanying drawings. The elements having the like functions are designated with the like reference numerals throughout the drawings and the same explanation is never repeated.

(Embodiment 1)

Figure 1B:
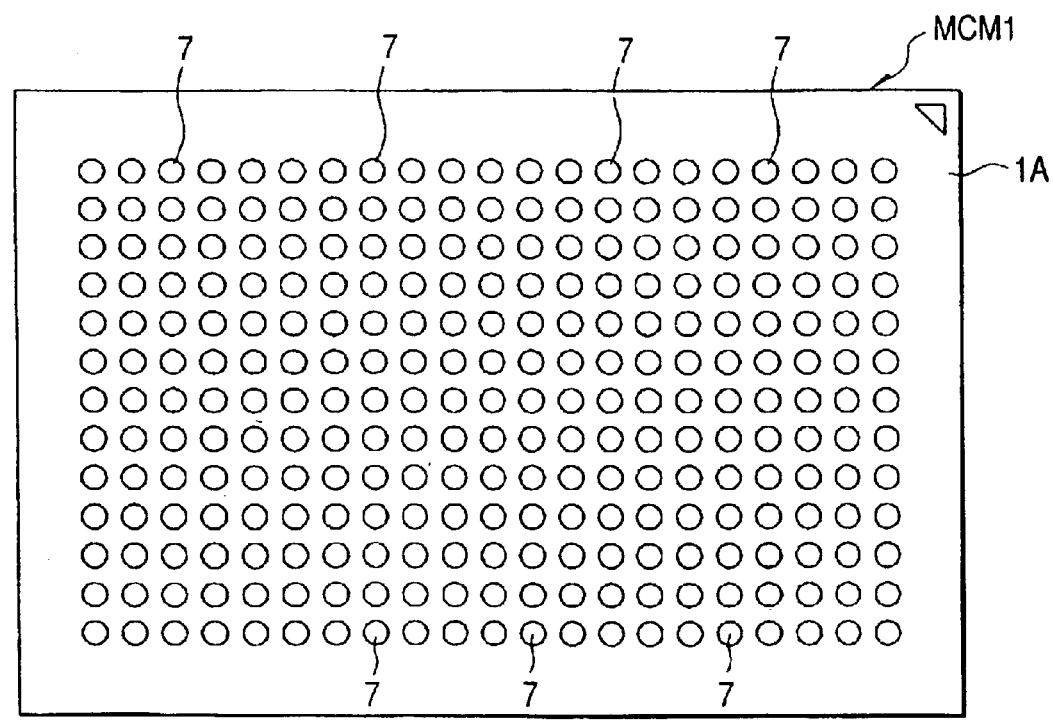
Figure 2:
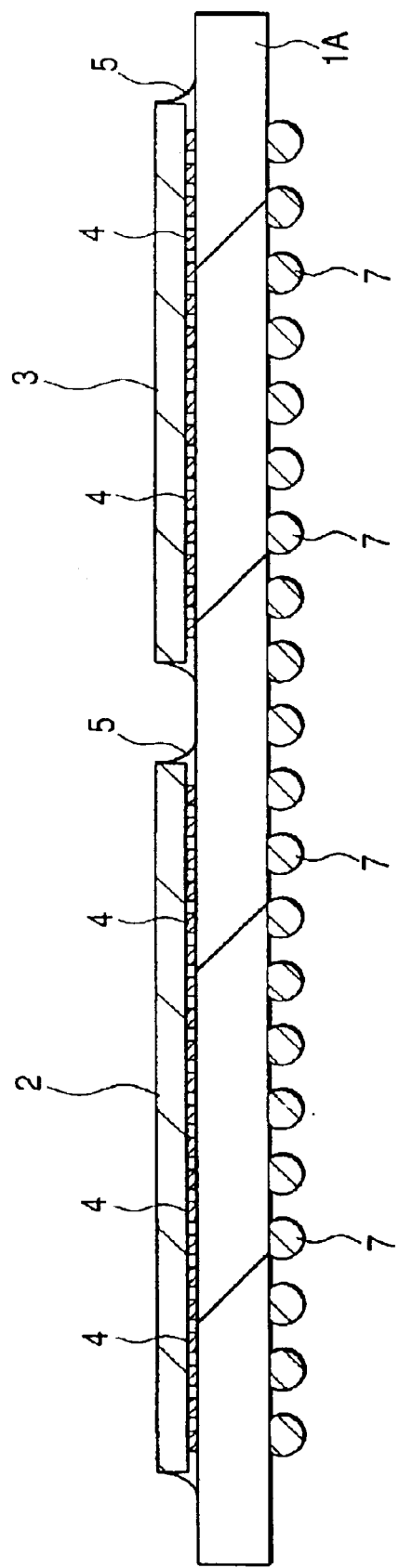
FIG. 2 is a cross-sectional view illustrating the first multi-chip module as an embodiment of the present invention.

FIG. 1(a) is a plan view of the front surface side of a semiconductor device of this embodiment. FIG. 1(b) is a plan view of the rear surface side of the same semiconductor device. FIG. 2 is a cross-sectional view of the same semiconductor device.

The semiconductor device illustrated in FIG. 1 and FIG. 2 is a multi-chip module (MCM1) where one memory chip 2 and one control chip 3 are mounted on the main surface of a module substrate (wiring board) 1A with the face-down method. The memory chip 2 and control chip 3 are allocated side by side on the main surface of the module substrate 1A and are electrically connected to the module substrate 1 via a plurality of solder bumps (bump electrodes) 4 formed on the respective main surfaces. Moreover, an under-fill resin (sealing resin) 5 fills the gap between the respective memory chip 2 and control chip 3 and the module substrate 1A.

The memory chip 2 is a silicon chip on which a DRAM (Dynamic Random Access Memory), for example, having the storage capacity of 65 Mbits is formed and the control chip 3 is a silicon chip on which a high speed microprocessor (MPU: Ultra small-size arithmetic processor) is formed.

The memory chip 2 and control chip 3 are has a structure called the CSP (Chip Scale Package) formed through application of the wafer process explained later, namely the wafer process package having completed the process up to the packaging in the wafer condition.

The module substrate 1A on which the memory chip 2 and control chip 3 are mounted is a multi-wiring substrate which is mainly formed of a general purpose resin such as epoxy resin including glass fiber (glass epoxy resin) and the wiring 6 not illustrated in FIG. 1 and FIG. 2 is formed on the main surface thereof. The solder bumps 4 formed on the respective main surfaces of the memory chip 2 and control chip 3 are electrically connected to one end (pad) of the wiring 6 formed on the main surface of the module substrate 1A.

At the rear surface of the module substrate 1A, a plurality of bumps 7 forming the external connecting terminal of the multi-chip module (MCM1) are arranged in the form of a rear array. The multi-chip module (MCM1) is mounted to a mother board (loading substrate) of an electronic device via the solder bumps 7.

Figure 3:
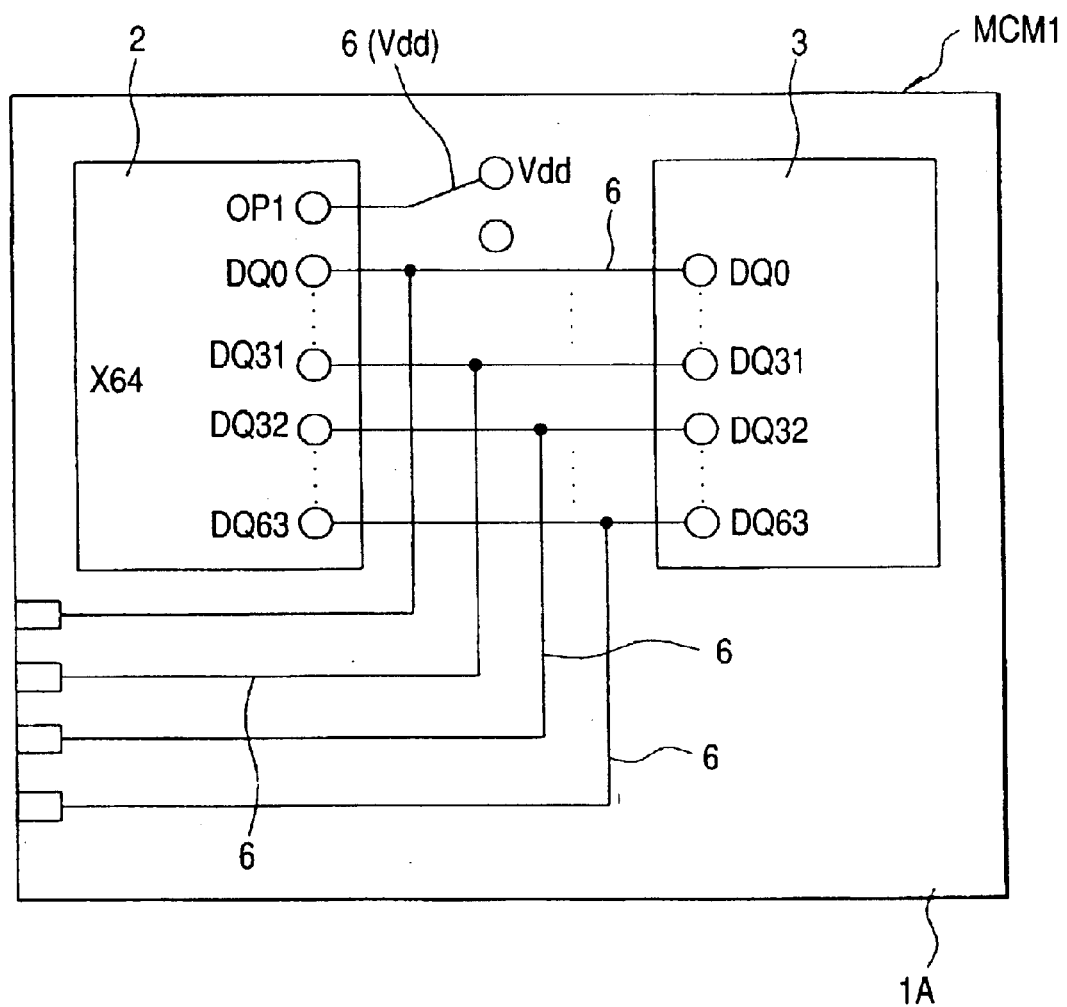
FIG. 3 is a plan view illustrating the concept of wiring of a module substrate for connecting data input/output pins of memory chip and data input/output pins of control chip.

FIG. 3 is a plan view illustrating the concept of the wiring 6 of the module substrate 1A for connecting the data input/output pins DQ of memory chip 2 to the data input/output pins DQ of control chip 3. As illustrated in the figure, the 64 data input/output pins DQ0 to DQ63 are formed on the main surface of the memory chip 2 and these 64 data input/output pins DQ0 to DQ63 are respectively connected electrically to the corresponding data input/output pins DQ0 to DQ63 of the control chip 3 via the wiring 6 of the module substrate 1A. Namely, the word configuration of the memory chip 2 is 1M×64 bits.

Moreover, on the main surface of memory chip 2, an option pin OP1 for the switching of functions electrically connected to the power supply voltage wiring 6 (Vdd) of the module substrate 1A is formed. The power supply voltage (Vdd) of the circuit is inputted to the option pin OP1 via the power supply voltage wiring 6 (Vdd).

The option pin OP1 is used to exchange the word configuration of memory chip 2. Namely, the memory chip 2 is structured to select the word configurations of 1M×64 bits and 2M×32 bits, when the power supply voltage (Vdd) is supplied to the option pin OP1 via the power supply voltage wiring 6 (Vdd) of module substrate 1A, the word configuration becomes ×64 bits and when the ground potential (Vss) is supplied, the word configuration becomes ×32 bits. As explained above, since the power supply voltage wiring 6 (Vdd) of module substrate 1A is connected to the option pin OP1 of memory chip 2, the word configuration of memory chip 2 becomes ×64 bits.

Figure 4:
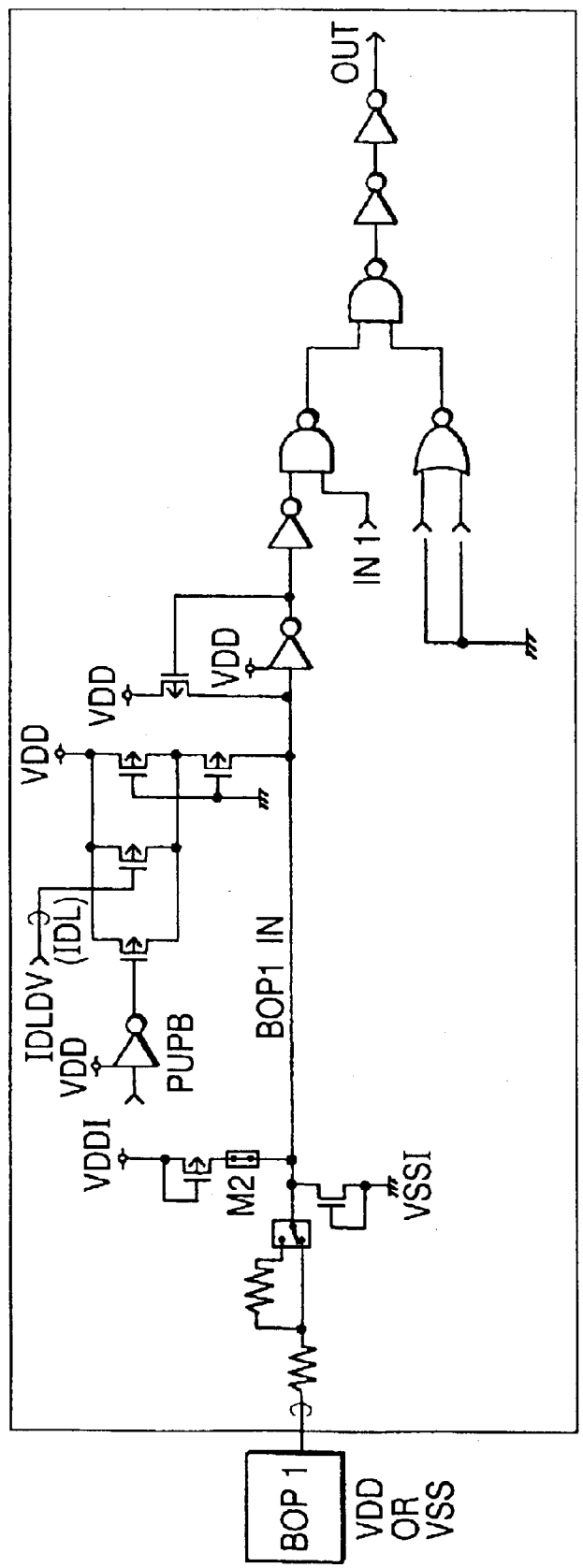
FIG. 4 is a diagram illustrating an example of an option switch circuit formed on a memory chip.

FIG. 4 is an example of the option switch circuit formed in the memory chip 2. This circuit is formed to output a high level signal or a low level signal depending on the power supply voltage (Vdd) or ground potential (Vss) to be inputted through the boding pad (electrode) BOP1 in the chip connected to the option pin OP1. At the rear stage of this circuit, a circuit (not illustrated) for switching the word configuration to 1M×64 bits or 2M×32 bits is provided and the word configuration is selected depending on the high level or low level of the signal supplied from the option switch circuit.

Figure 5:
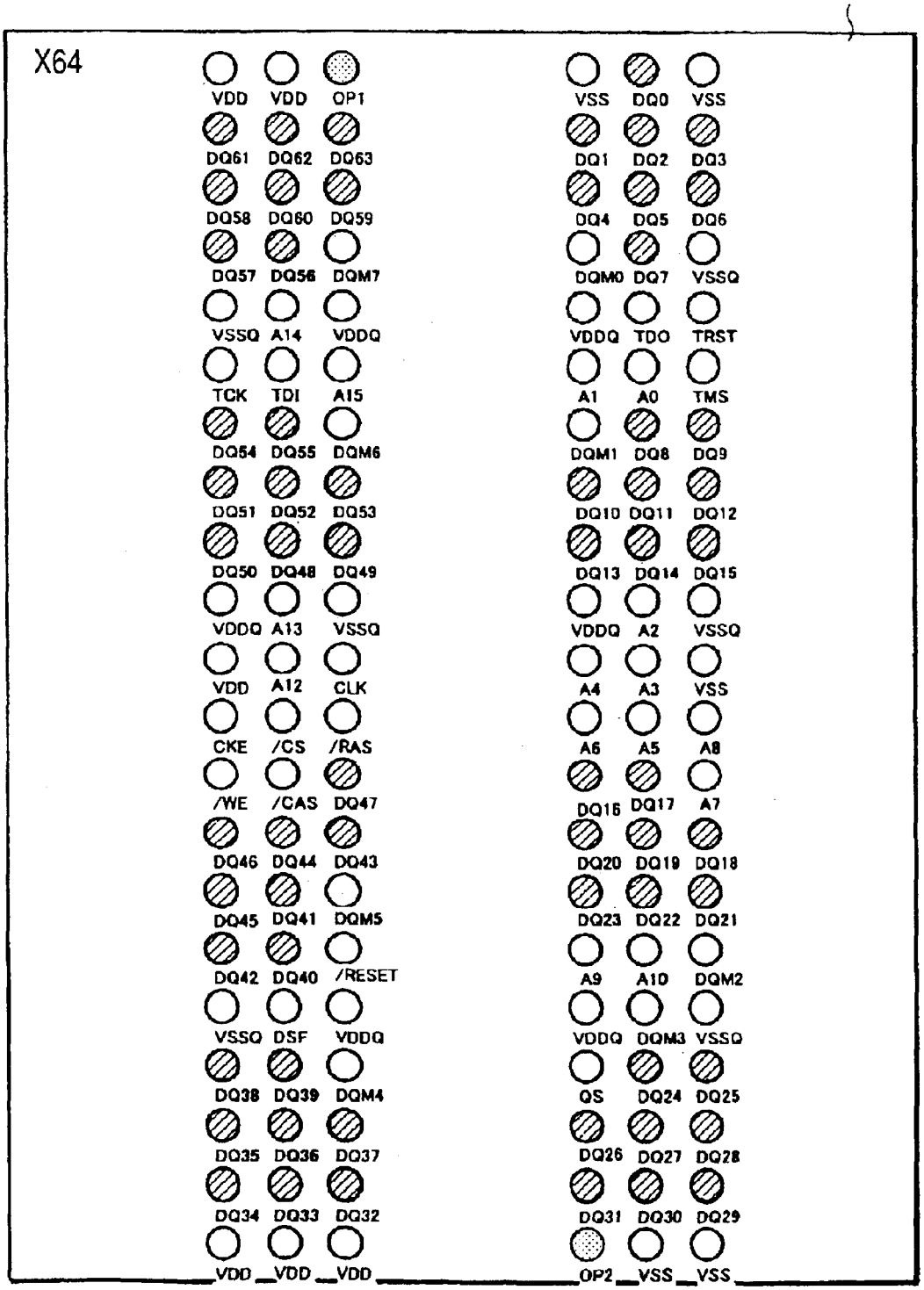
FIG. 5 is a plan view illustrating layout of pins of the memory chip.

FIG. 5 is a plan view illustrating an example of actual pin layout of memory chip 2. As illustrated in the figure, the memory chip 2 is provided with 126 pins in total including the address input pins A0 to A15, power supply voltage pin Vdd, ground potential pin Vss and second option pin OP2, in addition to 64 data input/ouput pins DQ0 to DQ63 and option pin OP1 explained above.

The second option pin OP2 is used to switch the operation mode of memory chip 2. Namely, the memory chip 2 is configured to select a reading system of the DDR mode and SD mode. For example, when the power supply voltage (Vdd) is inputted to the option pin OP2, the DDR mode operation is conducted and when the ground potential (Vss) is inputted, the SD mode operation is performed. Although not illustrated in the figure, in the multi-chip module (MCM1), the power supply voltage wiring 6 (Vdd) of the module substrate 1A is connected to the option pin OP2 of memory chip 2 and the memory chip 2 is operated in the DDR mode.

Figure 6:
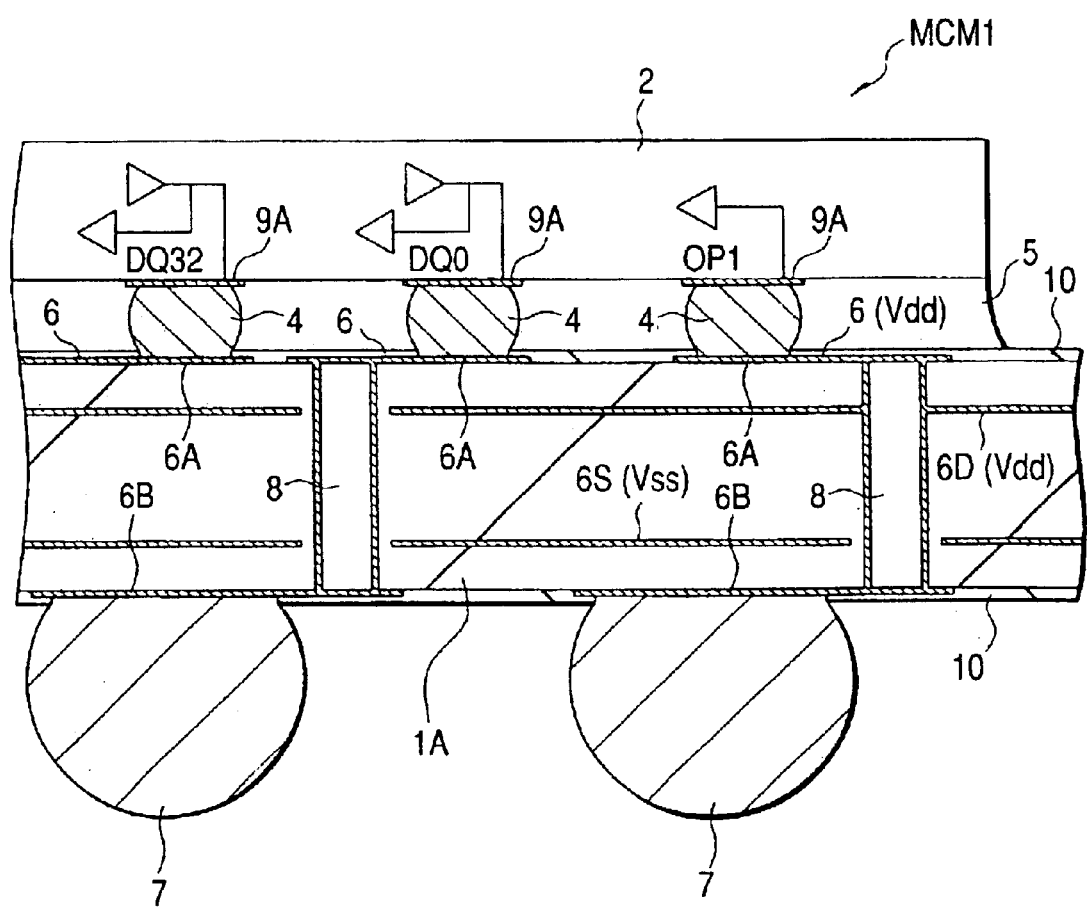
FIG. 6 is an enlarged cross-sectional view of the essential portion of the first multi-chip module as an embodiment of the present invention.

FIG. 6 is an enlarged cross-sectional view illustrating a part of the module substrate 1A of the multi-chip module (MCM1) and the memory chip 2 mounted on the main surface thereof. In this figure, the data input/output pins DQ0, DQ32 and option pin OP1 among the pins provided on the memory chip 2 are indicated.

As illustrated in the figure, the memory chip 2 is electrically connected to one end (pad 6A) of the wiring 6 of the main surface of the module substrate 1A via the solder bump 4 connected to the bump land 9A on the main surface. The memory chip 2 is provided with 126 pins and the solder bump 4 is connected to all bump lands 9A corresponding to these pins. Namely, 126 solder bumps 4 are formed on the main surface of memory chip 2.

Within the module substrate 1A, the power supply plane wiring 6D and ground plane wiring 6S are formed. The power supply plane wiring 6D, ground plane wiring 6S and the wiring 6 explained above are electrically connected to the pad 6B at the rear surface of the module substrate 1A via the through-hole 8 provided through the upper and lower surfaces of the module substrate 1A. Moreover, the pad 6B is connected to the solder bump 7 forming the external connection terminal of the multi-chip module (MCM1).

An under-fill resin 5 is applied to protect the connecting portion of the main surface of module substrate 1A and the memory chip 2 to the gap between these elements. Moreover, the main surface of the module substrate 1A is coated with the solder resist 10 to protect the wiring 6 except for the area where the pad 6A is formed. Similarly, the rear surface of the module substrate 1A is coated with the solder register 10 except for the area where the pad 6B is formed. Although not illustrated in the figure, the control chip 3 is also electrically connected to the pad 6A at the main surface of the module substrate 1A via the solder bump 4 formed on this main surface. In addition, the gap between the main surface of module substrate 1A and the control chip 3 is filled with the under-fill resin 5 to protect the connecting part thereof.

Figure 7:
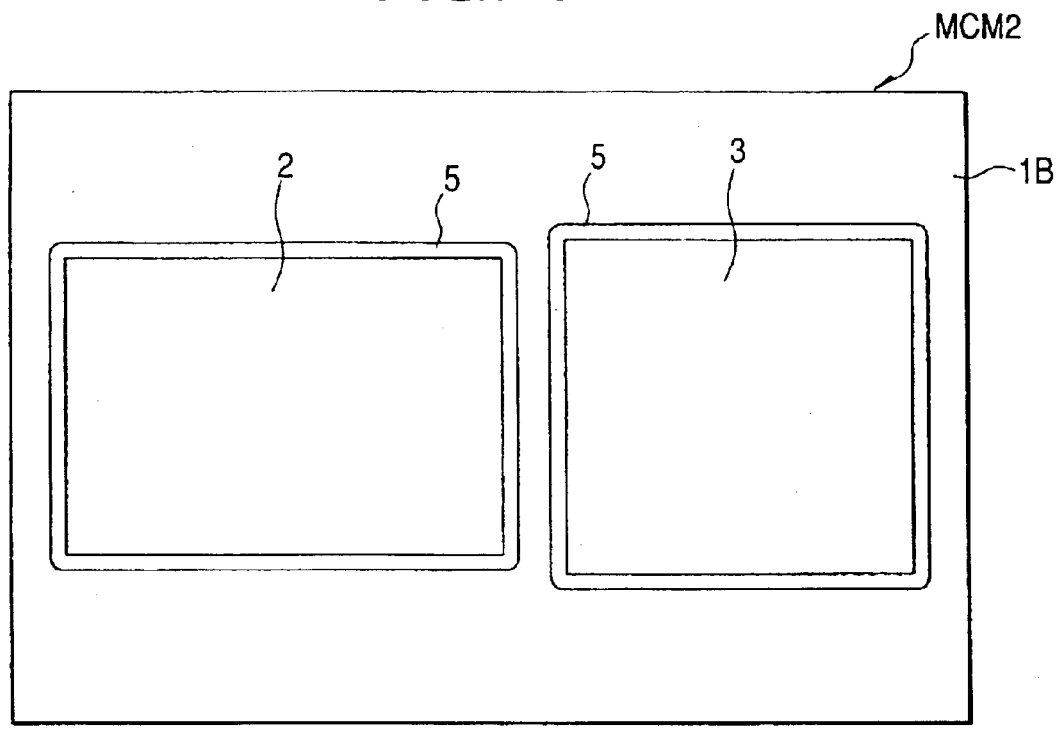
FIG. 7 is a plan view illustrating the second multi-chip module as an embodiment of the present invention.
Figure 8:
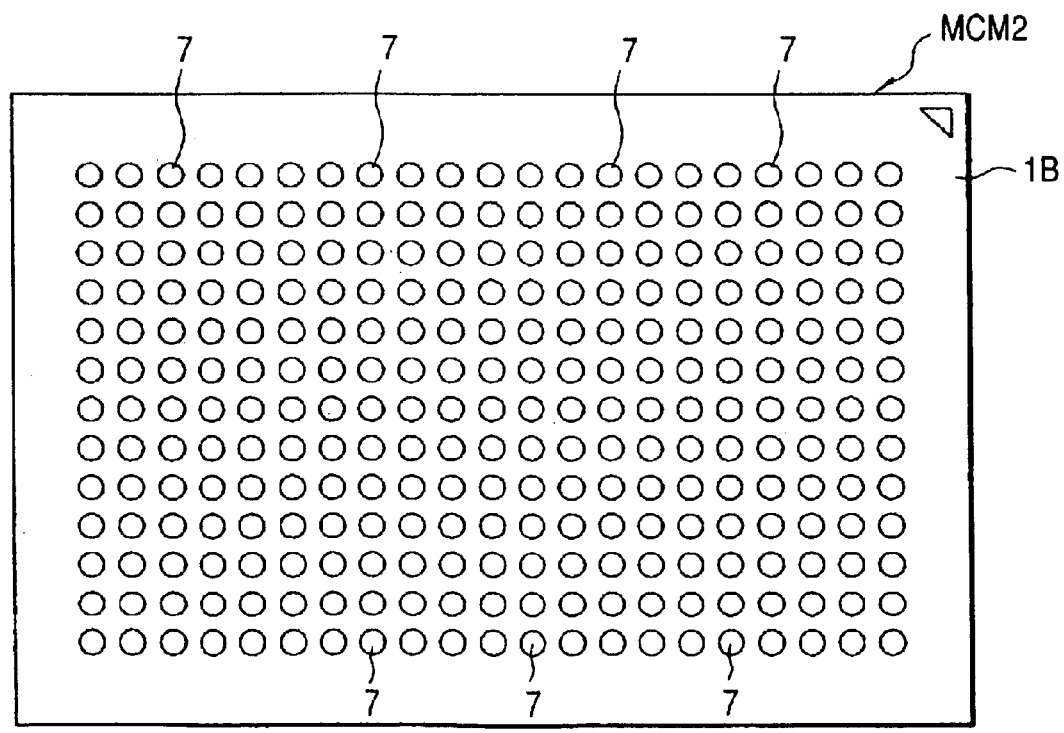
FIG. 8 is a plan view illustrating the second multi-chip module as an embodiment of the present invention.
Figure 9:
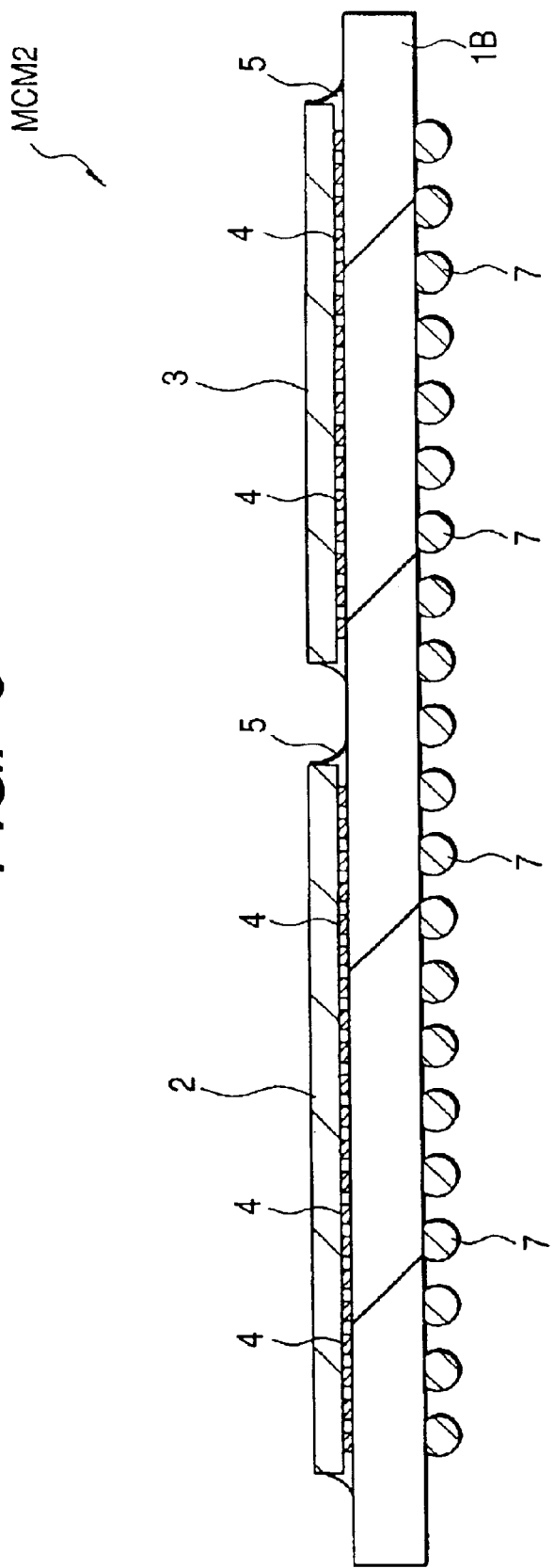
FIG. 9 is a cross-sectional view illustrating the first multi-chip module as an embodiment of the present invention.

FIG. 7 to FIG. 9 illustrate the second multi-chip module (MCM2) of this embodiment. This multi-chip module (MCM2) has a structure that one memory chip 2 and one control chip 3 are formed with the face-down method on the main surface of the module substrate 1B of which pattern of wiring 6 is different from that of the module substrate 1A of the first multi-chip module (MCM1).

The memory chip 2 mounted on the module substrate 1B is identical to the memory chip 2 mounted on the module substrate 1A of the first multi-chip module (MCM1), namely a silicon chip on which the DRAM having the storage capacity of 64 Mbits is formed. Moreover, the control chip 3 mounted on the module substrate 1B is identical to the control chip 3 mounted on the module substrate 1A, namely the silicon chip where the high speed microprocessor (MPU) is formed.

Figure 10:
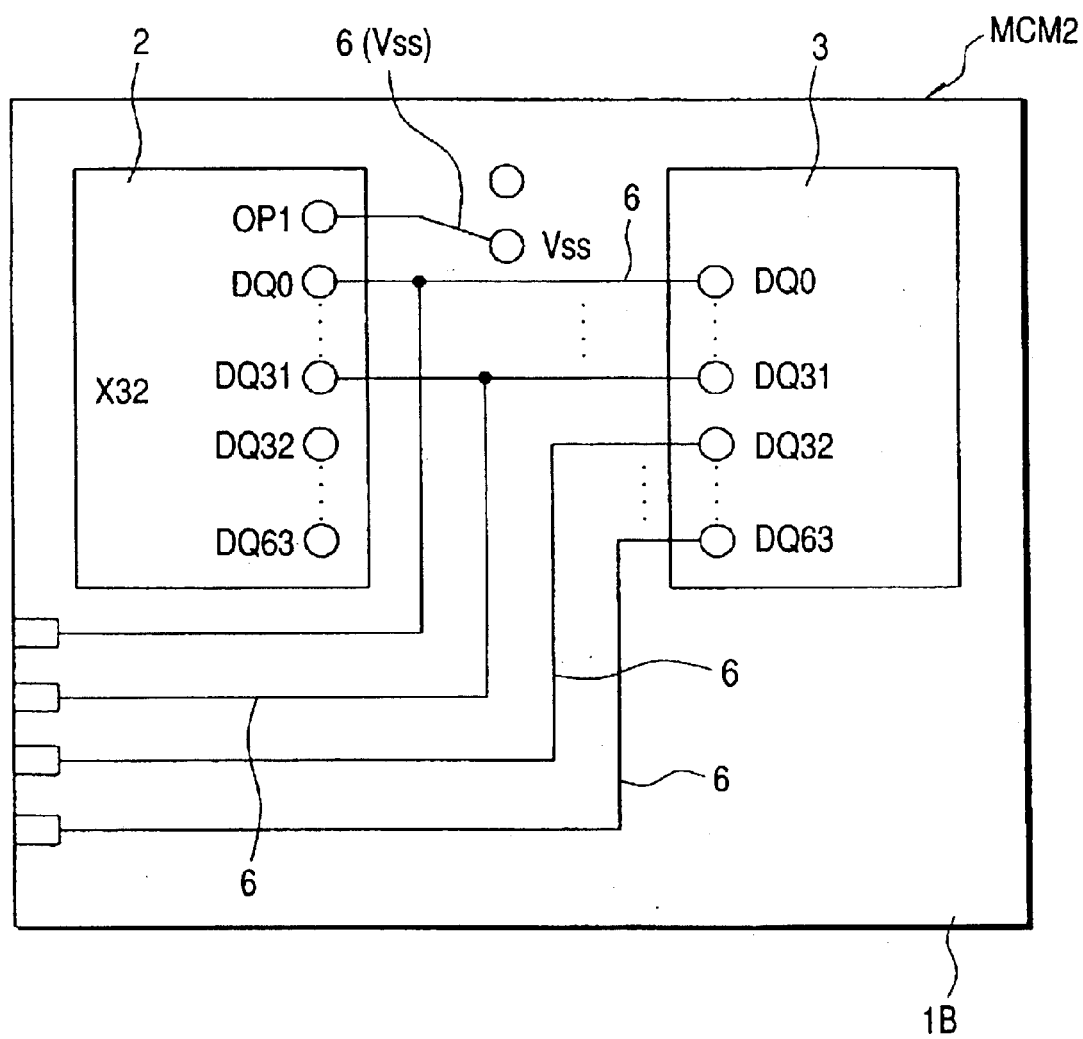
FIG. 10 is a plan view illustrating the concept of wiring of a module substrate for connecting data input/output pins of the memory chip with data input/output pins of control chip.

FIG. 10 is a plan view illustrating the concept of wiring 6 of the module substrate 1B connecting the data input/ output pins DQ of memory chip 2 and the data input/output pins DQ of the control chip 3. In the case of this multi-chip module (MCM2), since the option pin OP1 for selecting the word configuration of memory chip 2 is connected to the ground potential wiring 6 (Vss) of the module substrate 1B, the ground potential (Vss) of the circuit is supplied to the option pin OP1. In addition, only remaining 32 data input/output pins DQ32 to DQ63 among the 64 data input/output pins DQ0 to DQ63 formed on the memory chip 2 are connected to the corresponding data input/output pins DQ of the control chip 3 via the wiring 6 of the module substrate 1B and the wiring 6 for connecting the remaining 32 data input/output pins DQ32 to DQ63 and the corresponding data input/output pins DQ32 to DQ63 of the control chip 3 is not formed on the module substrate 1B. Namely, the multi-chip module (MCM2) is configured to form the word configuration of ×32 bits of the memory chip 2.

Figure 11:
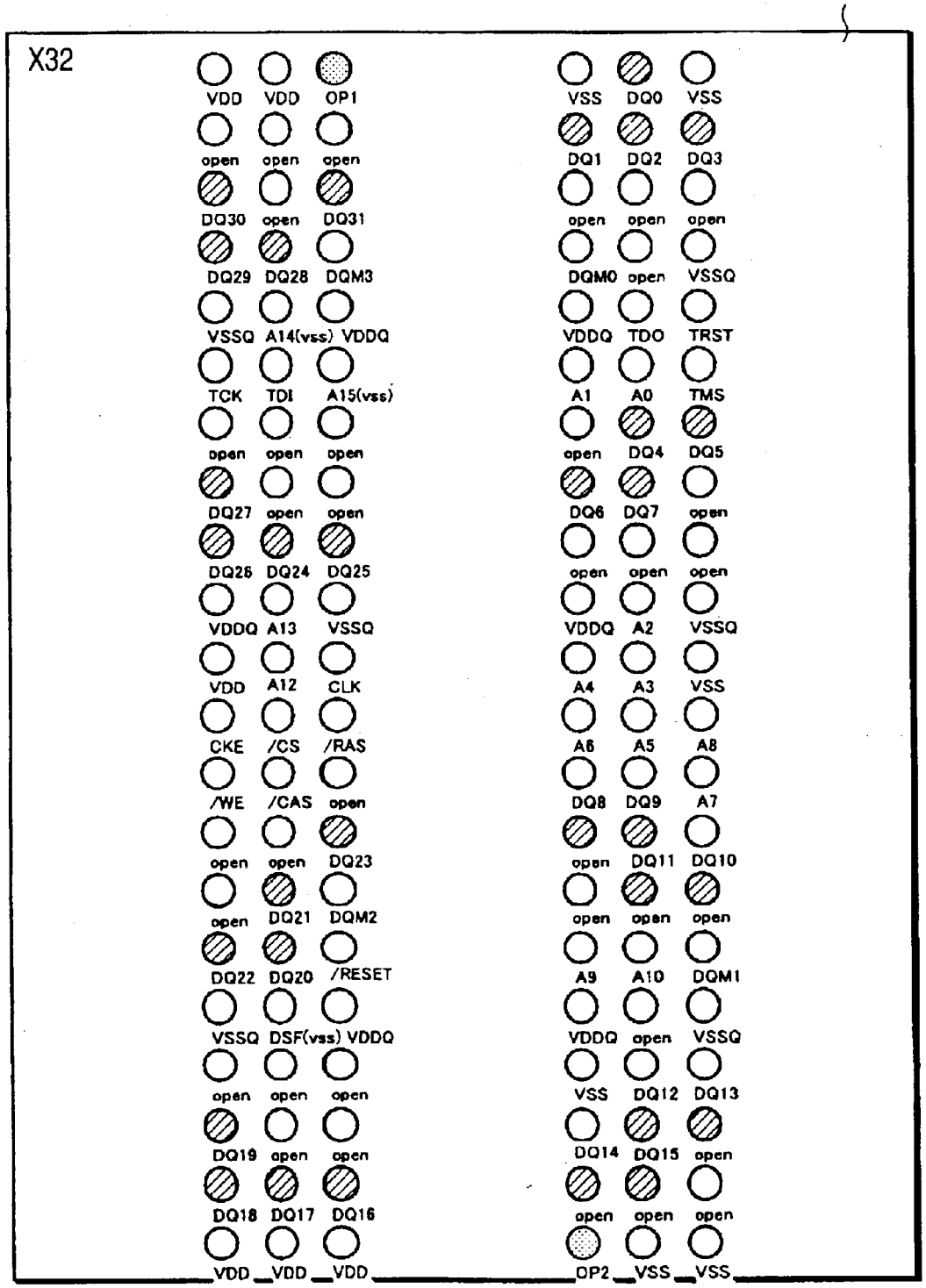
FIG. 11 is a plan view illustrating the layout of pins of the memory chip.

FIG. 11 is a plan view illustrating an example of the actual pin layout of the memory chip 2 mounted on the module substrate 1B. When the word configuration is ×64 bits, the 32 pins as the data input/output pins DQ32 to DQ63 are indicated as "open". Although not illustrated, the module substrate 1B is connected to the option pin OP2 of memory chip 2 with the ground potential wiring 6 (Vss). Therefore, in the multi-chip module (MCM2), the memory chip 2 is operated in the SD mode.

Figure 12:
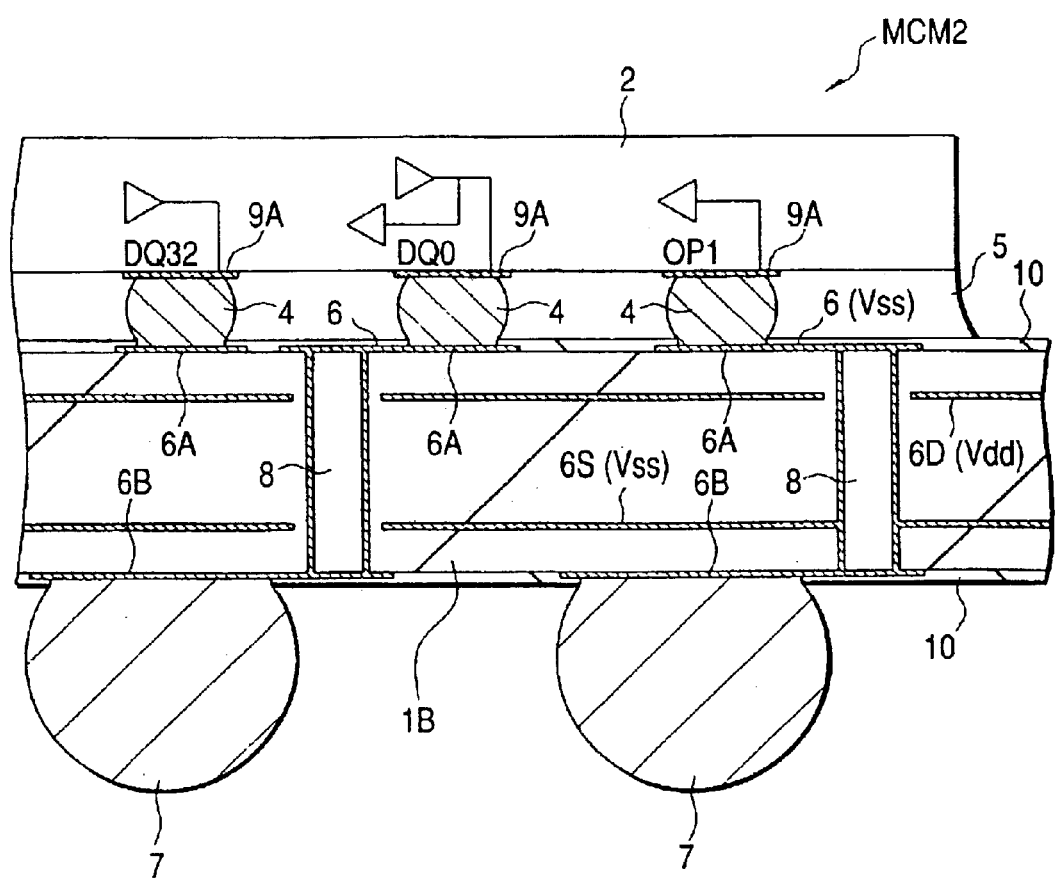
FIG. 12 is an enlarged cross-sectional view of the second multi-chip module as an embodiment of the present invention.

FIG. 12 is an enlarged cross-sectional view illustrating a part of the module substrate 1B of the multi-chip module (MCM2) and the memory chip 2 mounted on the main surface thereof. As illustrated in the figure, the memory chip 2 is electrically connected to one end (pad 6) of the wiring 6 on the main surface of the module substrate 1B via the solder bump 4 connected to the bump 1 and 9A on the main surface thereof.

In the memory chip 2 mounted on the module substrate 1B, the word configuration is ×32 bits. Therefore, when the word configuration becomes ×64 bits, the data is never outputted from the open pins forming the data input/output pins DQ32 to DQ63. Therefore, any problem does not occur in the circuit even when the solder bumps 4 are not connected to the bump lands 9A corresponding to the open pins. However, in this embodiment, the bump lands 9A corresponding to the data input/output pins DQ32 to DQ63 (open pins) not used are also connected with the solder bumps 4. Namely, in the memory chip 2, the 126 pins including the data input/output pins DQ32 to DQ63 (open pins) not used are all electrically connected to the pad 6A of the module substrate 1B via the solder bumps 4. However, the wiring 6 is not connected to the pad 6A of the module substrate 1B which is electrically connected to the data input/output pins DQ32 to DQ63 (open pins) of the memory chip 2. Namely, the pads 6A of the module substrate 1B corresponding to the data input/output pins DQ32 to DQ63 (open pins) of the memory chip 2 are respectively formed in the isolated pattern.

As explained above, in this embodiment, two kinds of module substrates 1A, 1B having different patterns of the wiring 6 including the power supply voltage wiring 6 (Vdd) and the ground potential wiring 6 (Vss) are prepared and the two kinds of multi-chip modules (MCM1, MCM2) in different functions of the word configuration and operation mode can be realized by loading the memory chip 2 and control chip 3 to these two kinds of module substrates 1A, 1B. Accordingly, it is no longer required in the wafer process to prepare different kinds of memory chips 2 in different word configuration and read system. Namely, according to this embodiment, a plurality of kinds of multi-chip modules (MCM1, MCM2) of different functions can be manufactured by loading the identical memory chip 2 respectively to the prepared different kinds of module substrates 1A and 1B.

Figure 13:
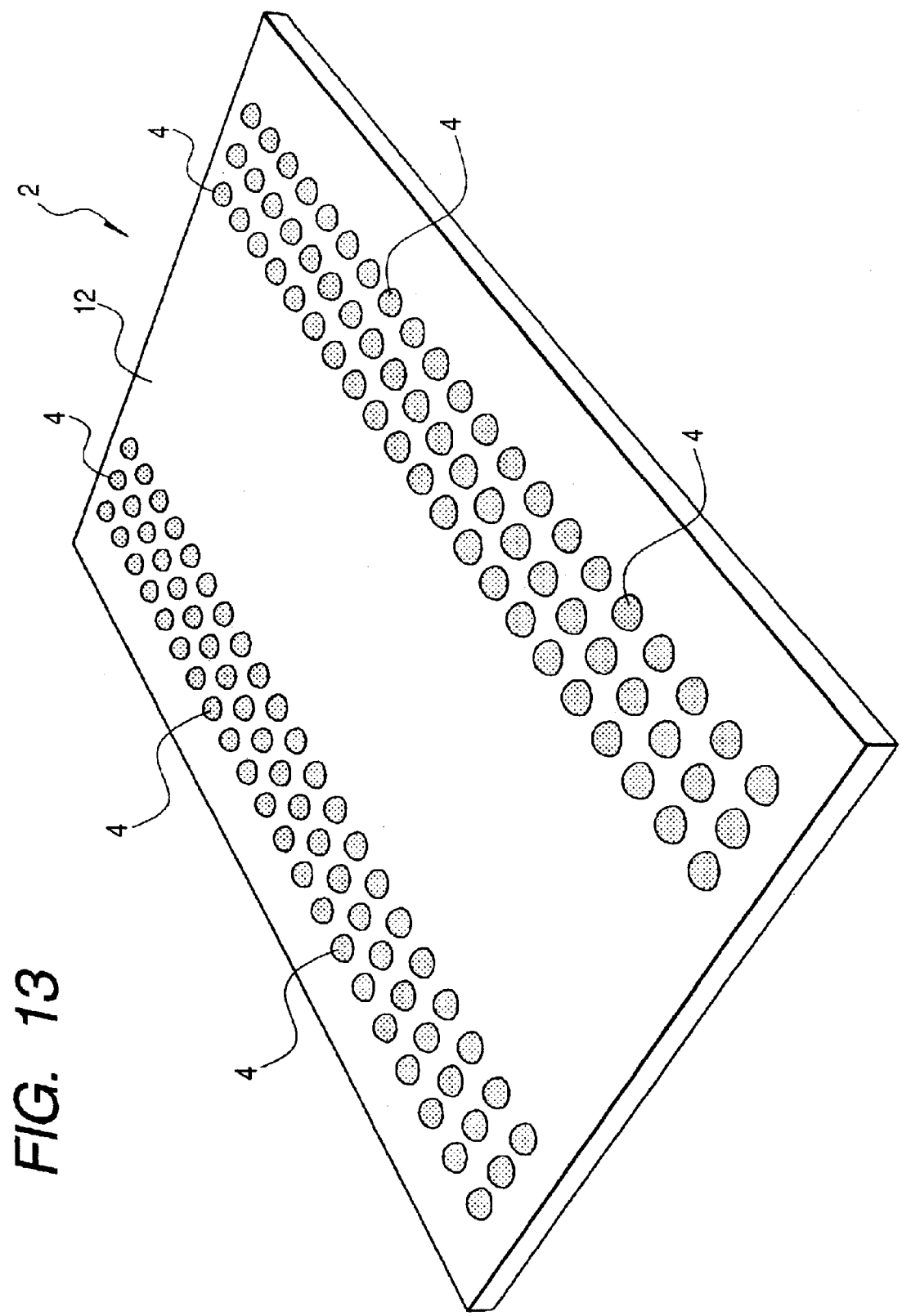
FIG. 13 is a perspective view illustrating the external appearance of the memory chip.
Figure 14:
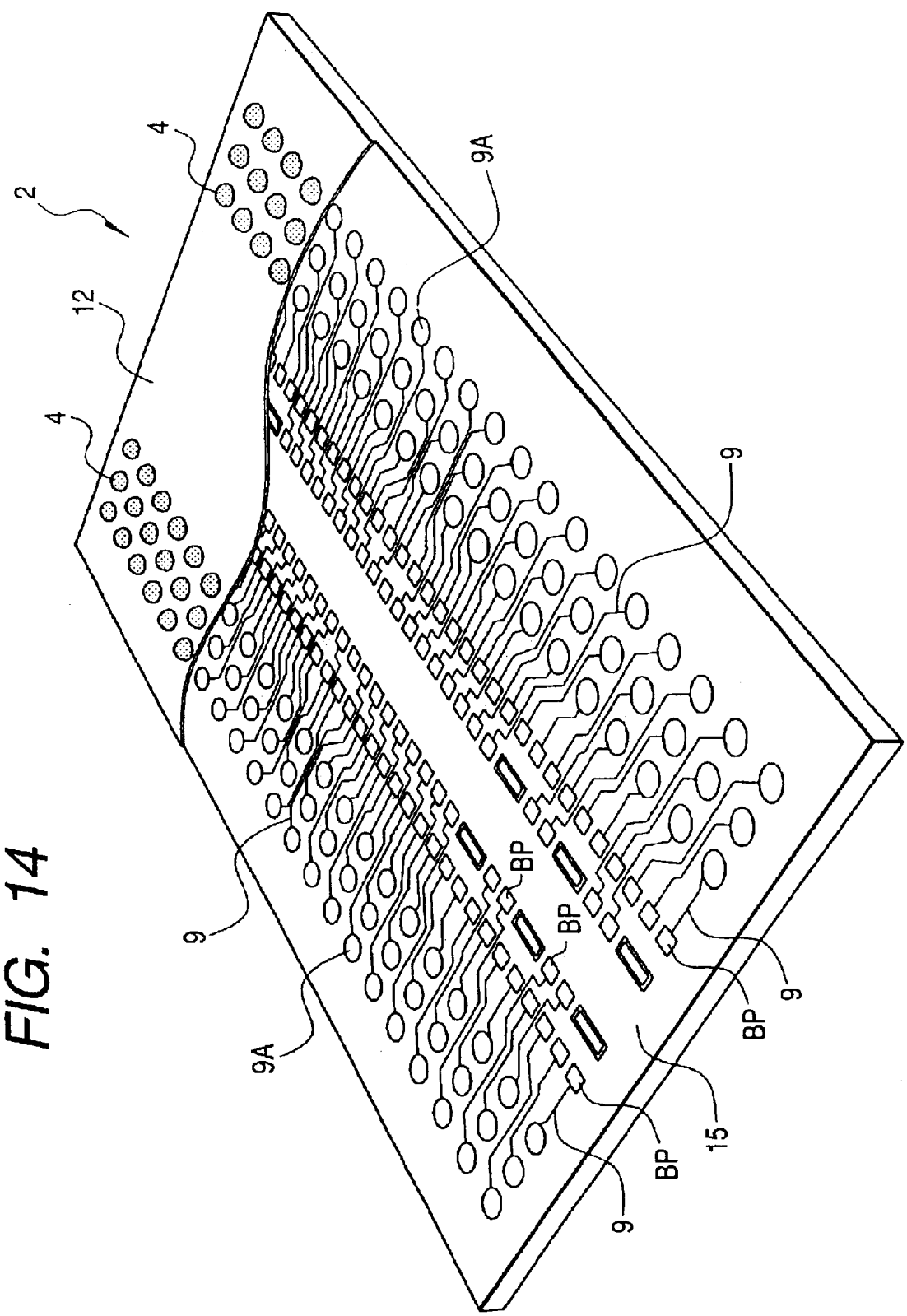
FIG. 14 is a perspective view illustrating a re-wiring pattern of the memory chip.
Figure 15:
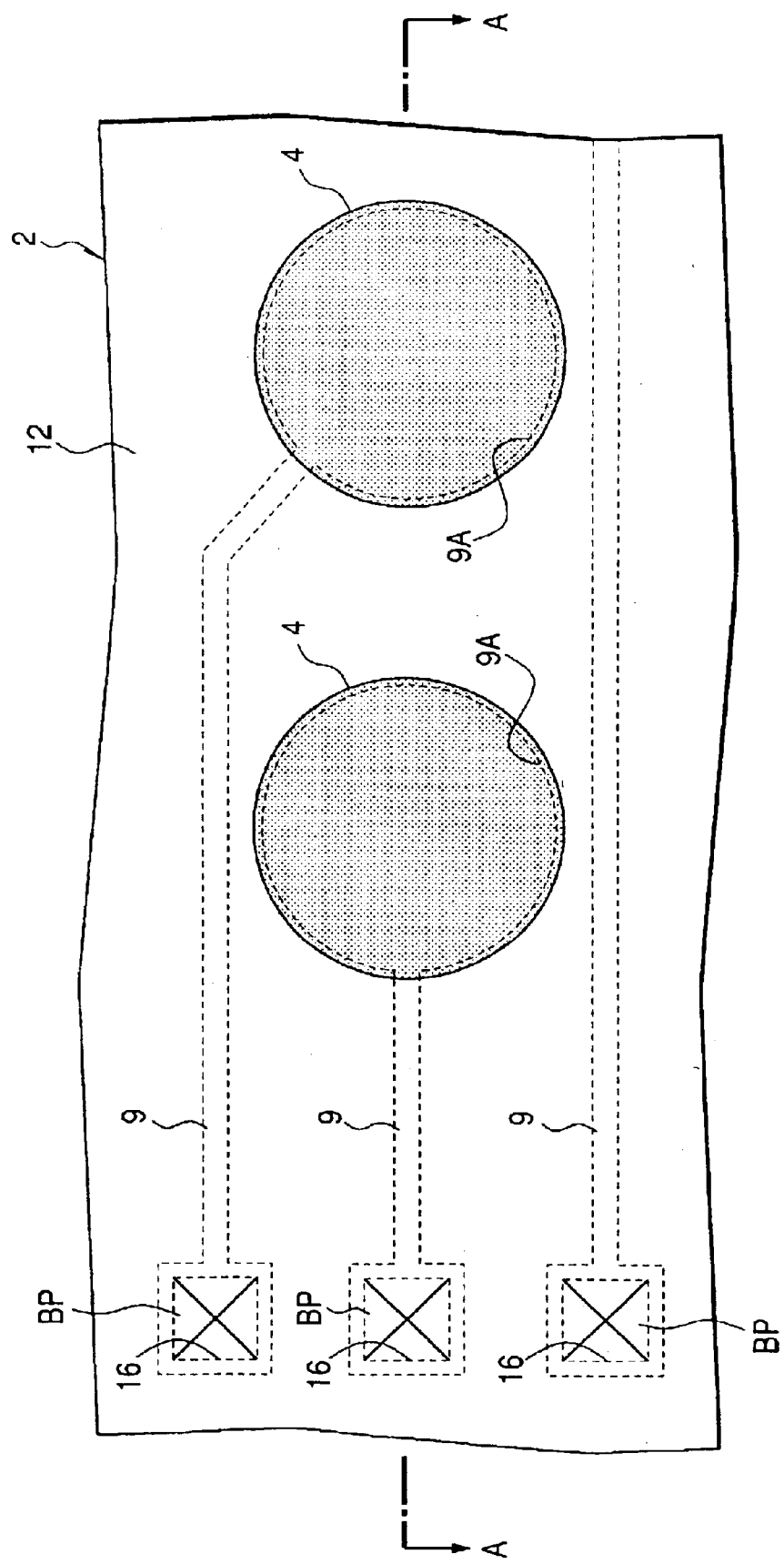
FIG. 15 is an enlarged plan view of the essential portion of FIG. 14.
Figure 16:
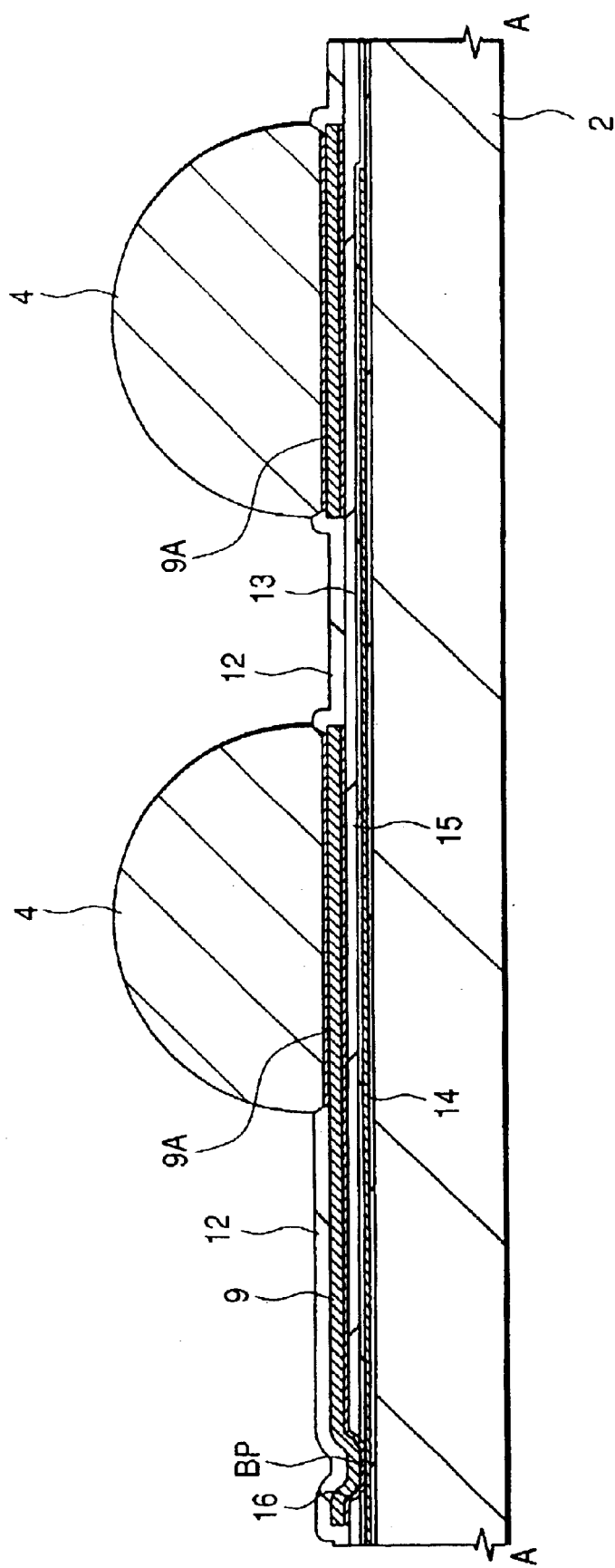
FIG. 16 is a cross-sectional view along the line A—A of FIG. 15.
Figure 17:
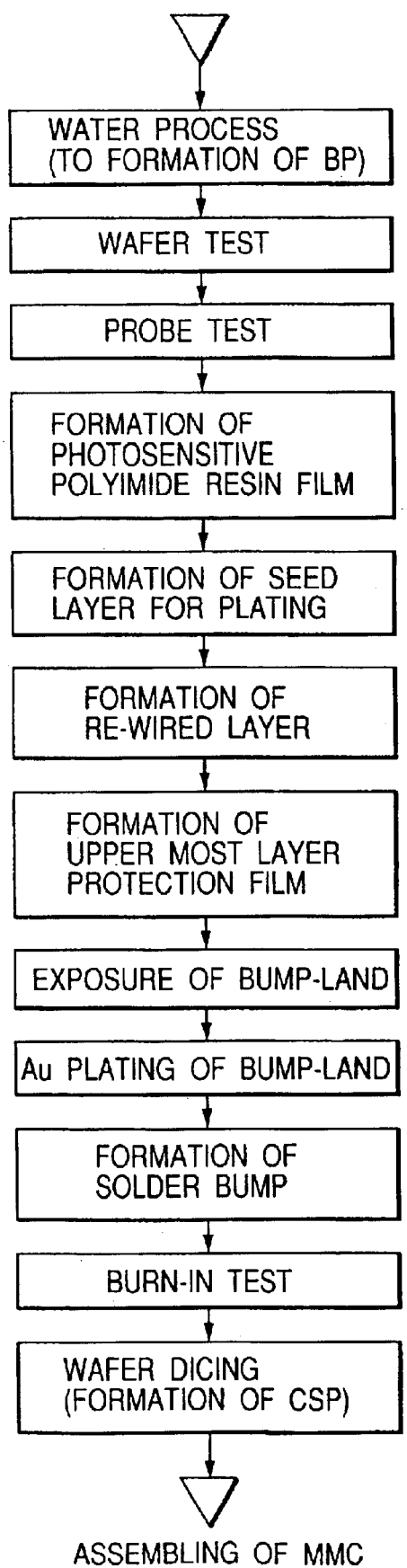
FIG. 17 is a flow diagram illustrating the manufacturing process of the memory chip.

Next, a method of manufacturing the memory chip 2 will be explained. FIG. 13 is a perspective view illustrating the external appearance of the completed memory chip 2. FIG. 14 is a perspective view illustrating a re-wiring pattern of the memory chip 2. FIG. 15 is an enlarged plan view of a part of the re-wiring pattern. FIG. 16 is a cross-sectional view along the line A—A of FIG. 15. FIG. 17 is a flow diagram illustrating the manufacturing processes of the memory chip 2.

On the main surface of memory chip 2, a plurality of solder bumps 4 (126 bumps in this embodiment) and an upper most layer protecting film 12 for insulating among a plurality of bumps 4 are formed. As illustrated in the figure, the solder bumps 4 are allocated in the shape of area array on the main surface of the memory chip 2.

At the center of main surface of the memory chip 2, a plurality of bonding pads BP formed of a part of the upper most layer wiring 14 are allocated. The upper part of the upper most layer wiring 14 is covered with a surface protection film (passivation film) 13, except for the upper part of the bonding pad BP. Moreover, at the upper part of the surface protecting film 13, a re-wiring 9 is formed via a photosensitive polyimide resin film 15. Moreover, the upper part of re-wiring 9 is covered with the upper most layer protecting film 12, except for the upper part of the bump land 9A as one end thereof.

The other end of the re-wiring 9 is electrically connected to the bonding pad BP through an aperture 16 formed to the photosensitive polyimide resin film 15. Moreover, solder bumps 4 forming the external connecting terminal of the memory chip 2 are formed on the upper part of the bump land 9A as a part of the re-wiring 9.

Figure 18:
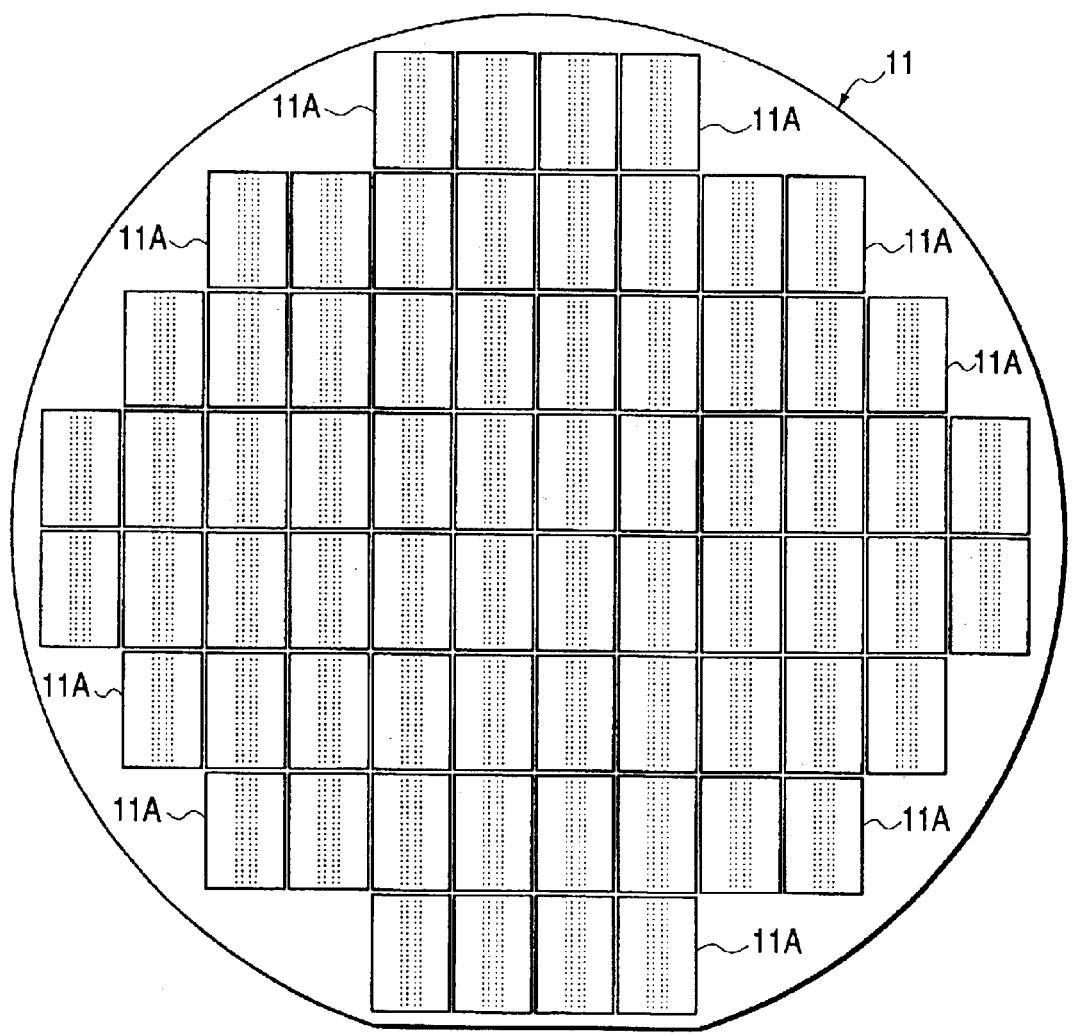
FIG. 18 is a plan view illustrating the manufacturing method of the memory chip.
Figure 19:
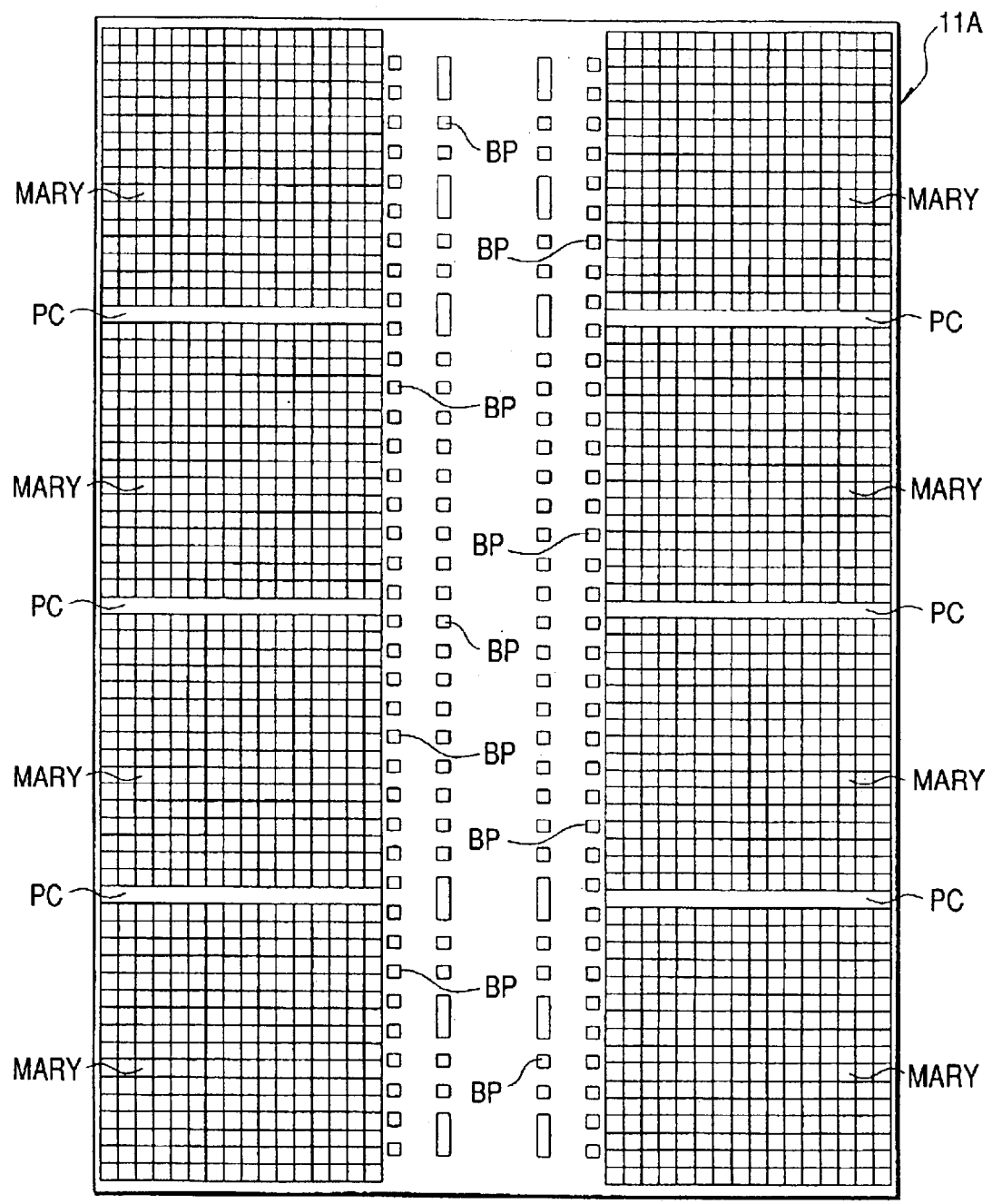
FIG. 19 is an enlarged plan view illustrating a part of FIG. 18.
Figure 20:
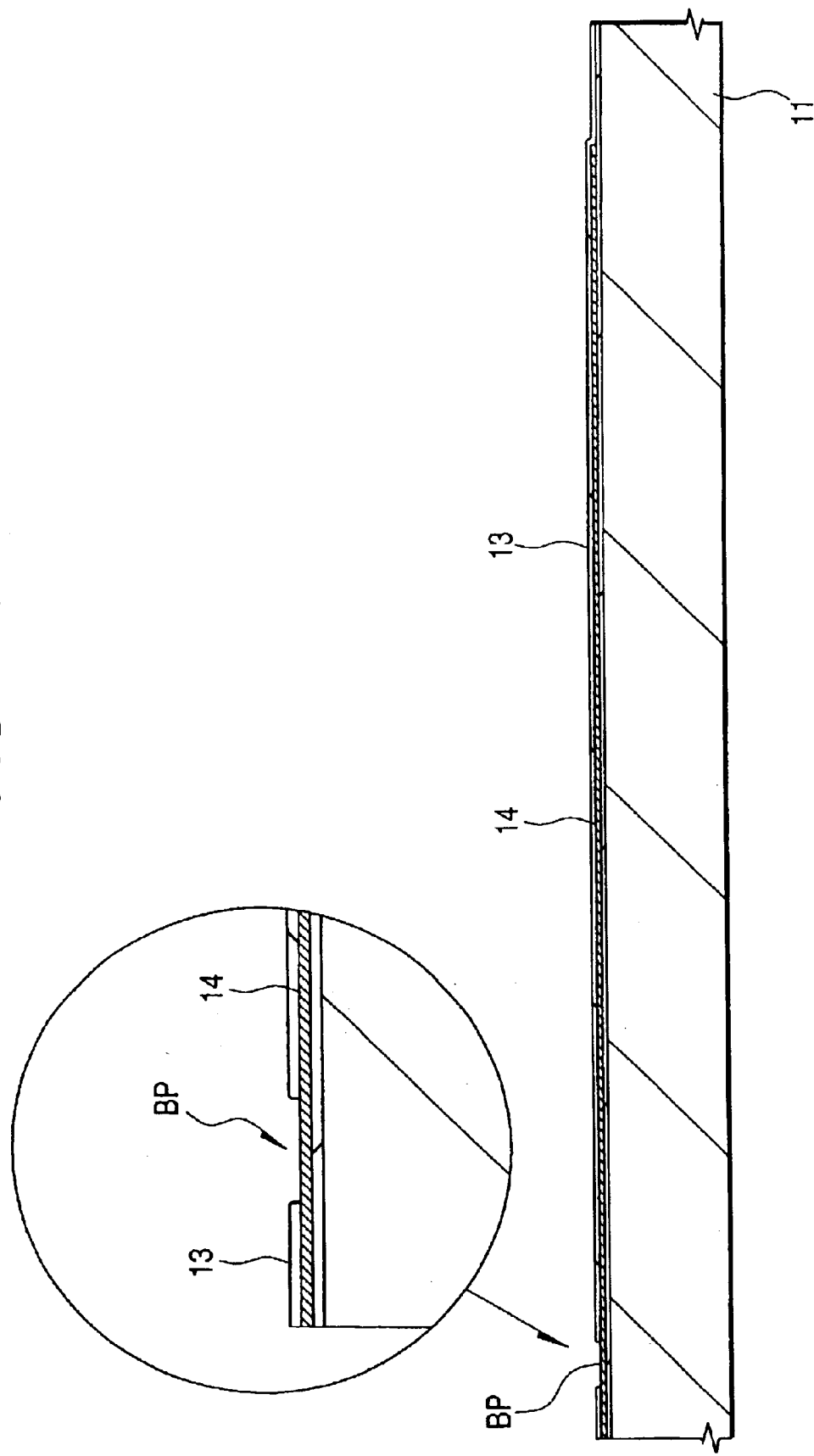
FIG. 20 is a cross-sectional view of the essential portion illustrating the manufacturing method of the memory chip.

For the manufacture of the memory chip 2 configured as explained above, a semiconductor wafer (hereinafter referred to as wafer) 11 consisting of a single-crystalline silicon as illustrated in FIGS. 18 to 20 is prepared. FIG. 18 is a total plan view of the wafer 11 and FIG. 19 is a plan view illustrating the area (chip area 11A) of one memory chip of the wafer 11. FIG. 20 is a cross-sectional view of the essential portion of the chip area 11A.

As illustrated in FIG. 18, the main surface of wafer 11 is partitioned to a plurality of chip areas 11A and a DRAM is formed in respective chip area 11A with the well known wafer process. As illustrated in FIG. 19, the DRAM is composed of a plurality of memory cell arrays (MARY) and the peripheral circuits (PC) allocated among these arrays. At the center of the chip area 11A, a plurality of bonding pads BP are allocated.

As illustrated in FIG. 20, the bonding pads BP allocated at the center of the chip area 11A are formed by opening the surface protection (passivation) film 13 covering the surface of the wafer 11 with the etching process to exposing a part of the upper-most layer wiring 14. The surface protection film 13 is formed of an insulation film formed by laminating, for example, a silicon oxide film and a silicon nitride film. Moreover, the upper-most layer wiring 14 (and bonding pad BP) is configured, for example, with an Al alloy film. The process up to formation of the bonding pad BP to each chip area 11A of the wafer 11 is executed with the well-known wafer process.

Figure 21:
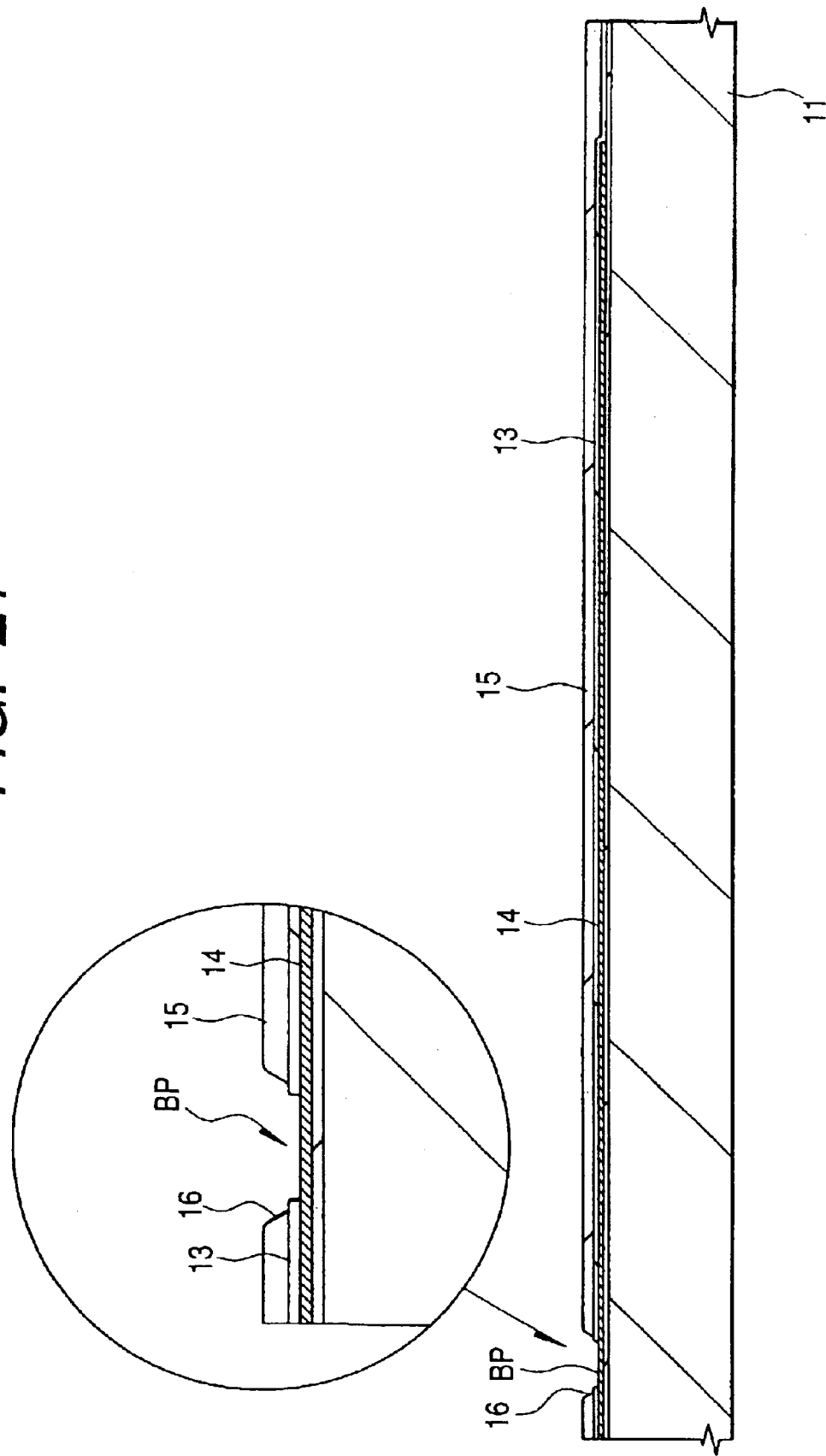
FIG. 21 is a cross-sectional view of the essential portion illustrating the manufacturing method of the memory chip.
Figure 22:
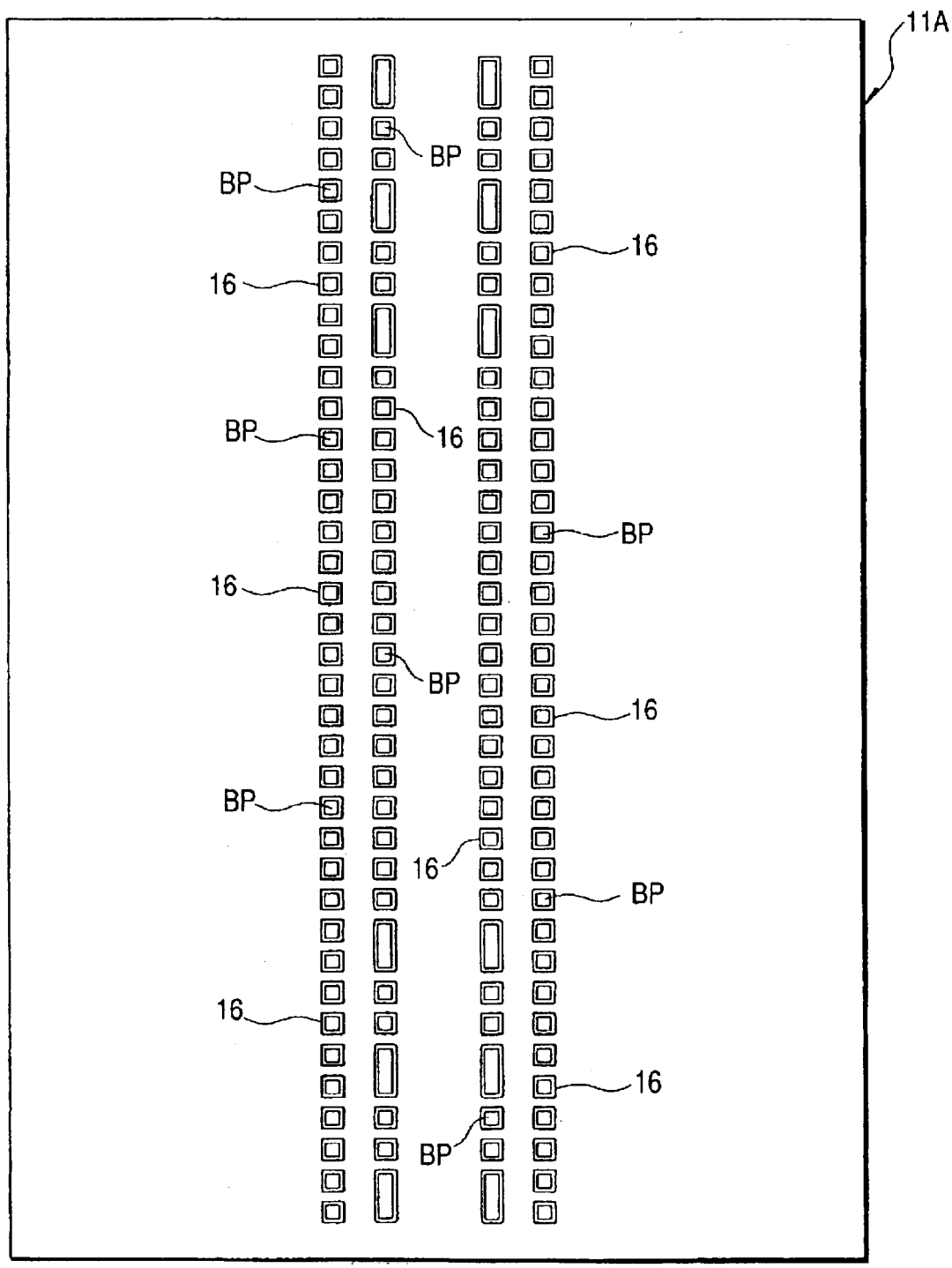
FIG. 22 is a plan view of the essential portion illustrating the manufacturing method of the memory chip.

Next, after conducting the test (wafer inspection and probe inspection) for discriminating good and no-good condition of each chip area 11A by applying a probe to the bonding pad PB, the re-wiring 9 is formed to each chip area 11 of the wafer 11. The re-wiring 9 can be formed as follow. First, as illustrated in FIG. 21 and FIG. 22, the upper part of the surface protection film 13 covering the surface of wafer 11 is coated with a photosensitive polyimide resin film 15 with the rotary coating method and thereafter a hole 16 is formed to the photosensitive polyimide resin film 15 at the upper part of bonding pad BP. The photosensitive polyimide resin film 15 functions in combination with the surface protection film 13 as the under-layer of resin film 15 as the interlayer insulation film to insulate between the upper-most wiring 14 and the re-wiring 9.

Figure 23:
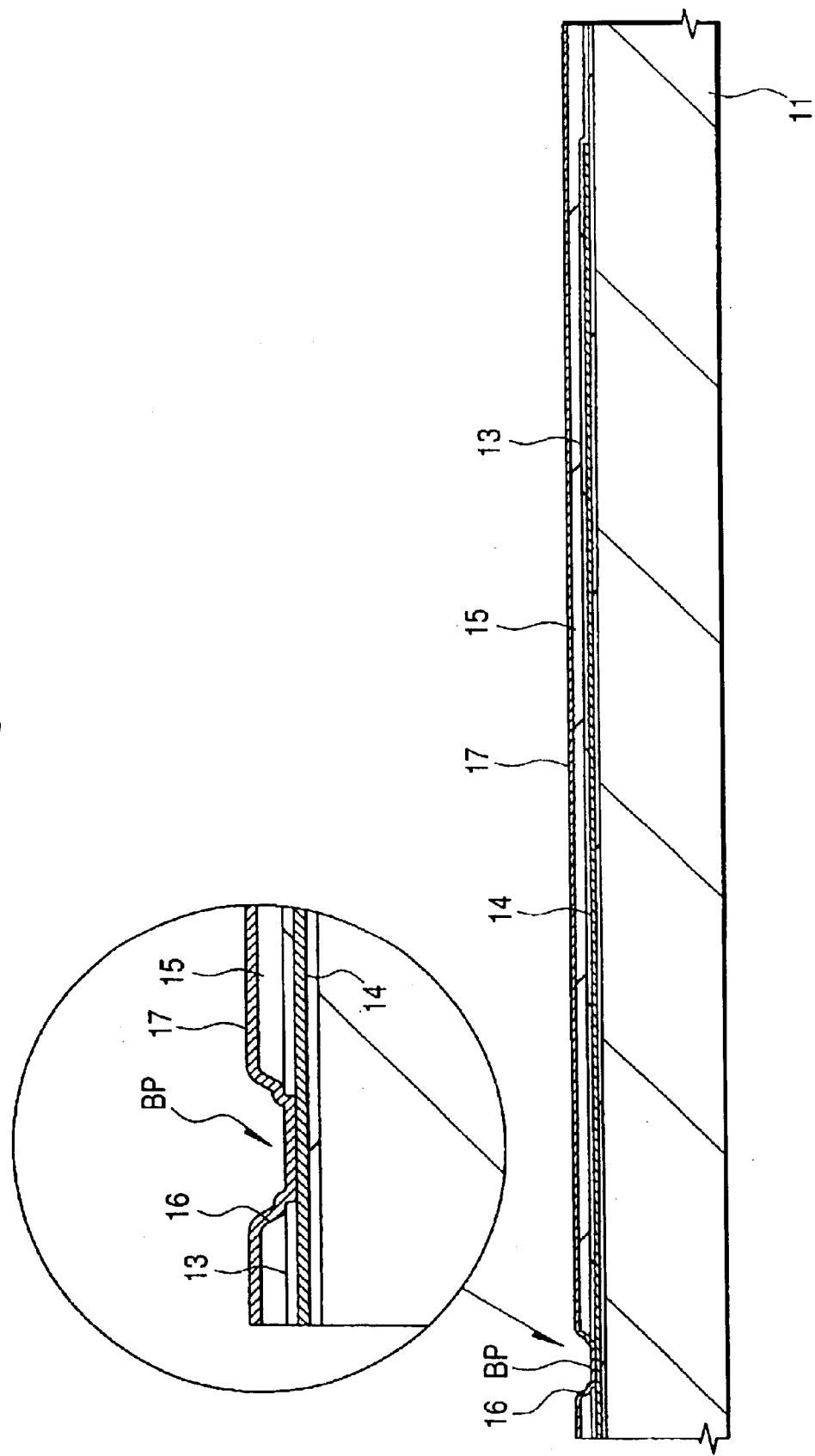
FIG. 23 is a cross-sectional view of the essential portion illustrating the manufacturing method of the memory chip.

Next, as illustrated in FIG. 23, a plating seed layer 17 is formed at the upper part of the photosensitive polyimide resin film 15 including the surface of the bonding pad BP exposed at the bottom part of the hole 16. The plating seed layer 17 is composed, for example, of a chromium (Cr) film and a copper (Cu) film.

Figure 24:
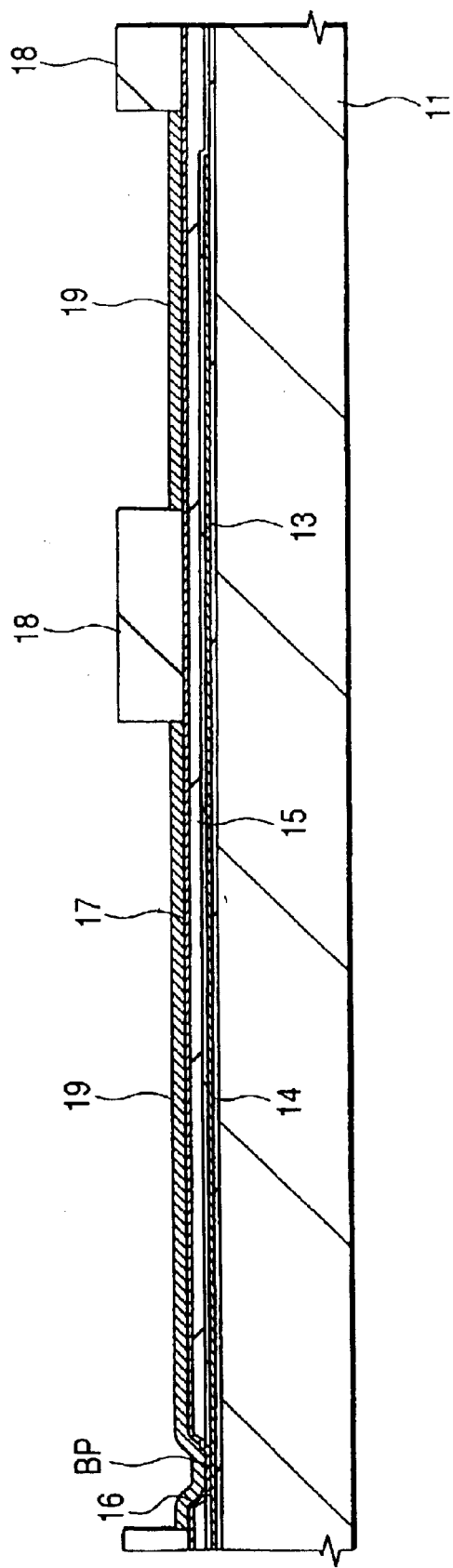
FIG. 24 is a cross-sectional view of the essential portion illustrating the manufacturing method of the memory chip.

Next, as illustrated in FIG. 24, a photoresist film 18 opening a hole to the re-wiring forming area is formed at the upper part of plating seed layer 17 and a metal film 19 is also formed with an electrolytic plating method 19 to the surface of the plating seed layer 17 in the re-wiring forming area. The metal film 19 is formed, for example, of a Cu film and nickel (Ni) film.

Figure 25:
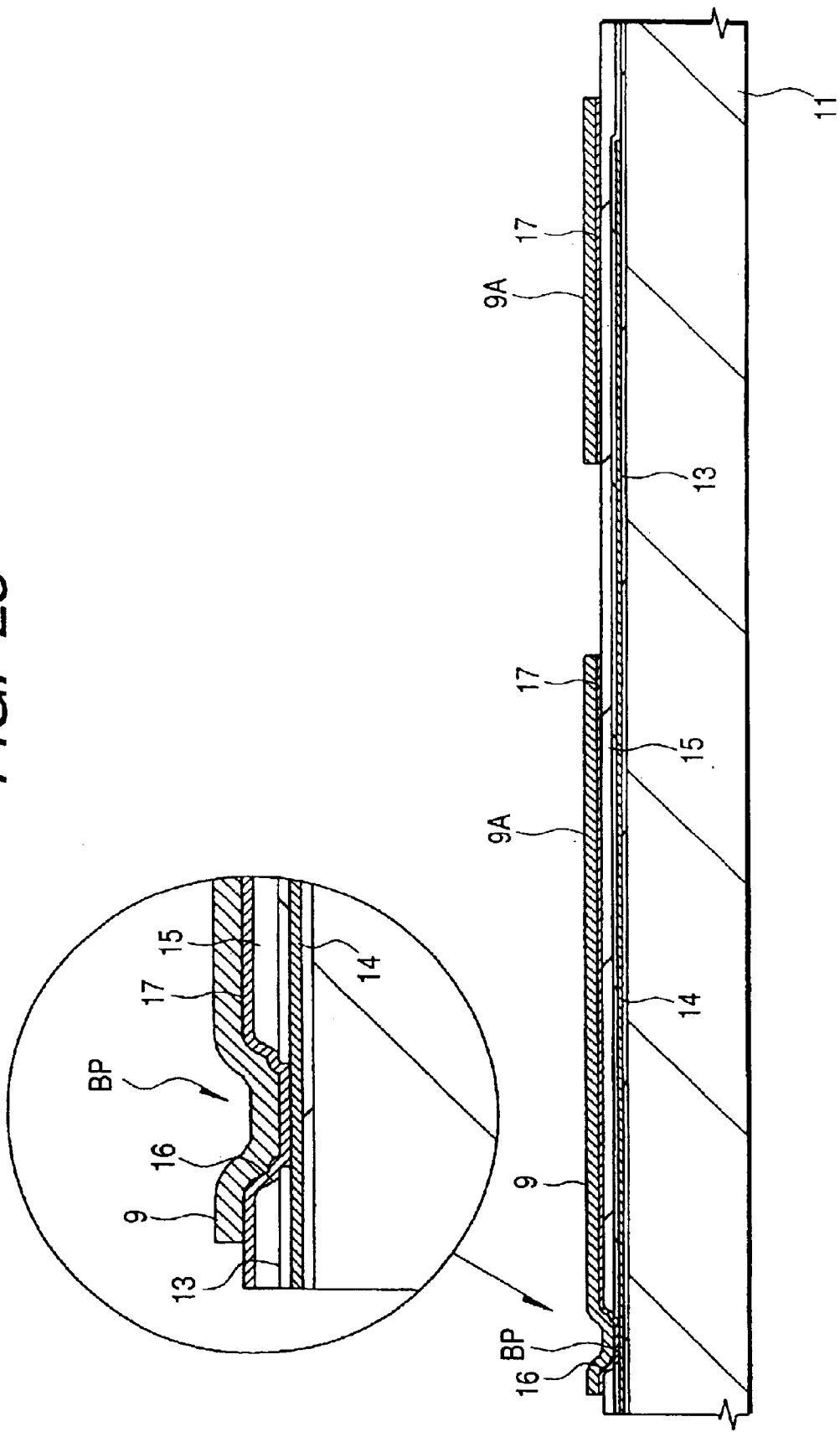
FIG. 25 is a cross-sectional view of the essential portion illustrating the manufacturing method of the memory chip.
Figure 26:
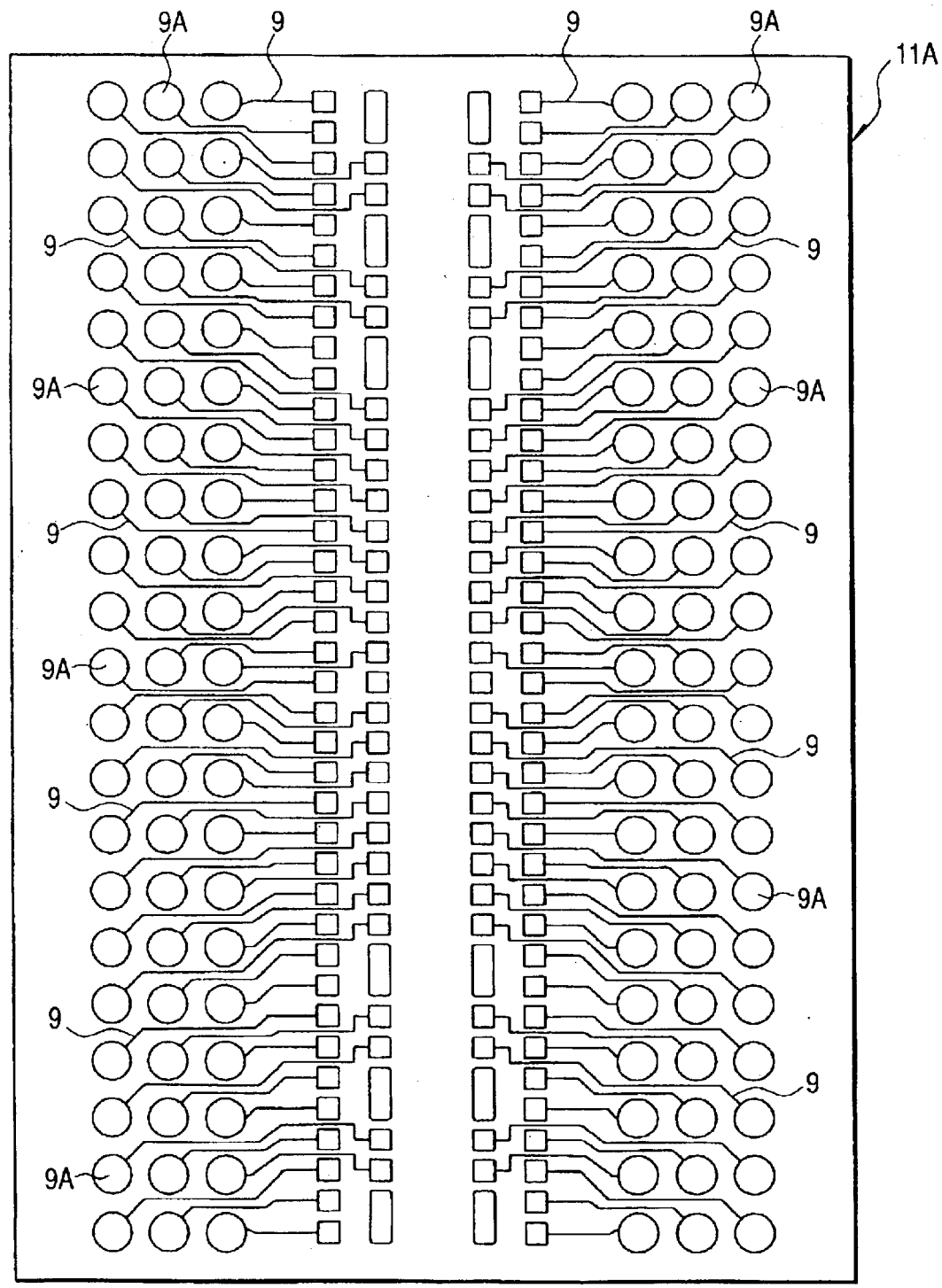
FIG. 26 is a plan view of the essential portion illustrating the manufacturing method of the memory chip.

Next, after removing the photoresist film 18, the re-wiring 9 formed of metal film 19 is formed, as illustrated in FIG. 25 and FIG. 26, by removing the lower plating seed layer 17 with the wet etching process.

Thereafter, as illustrated in FIG. 27, the upper-most layer protection film 12 consisting of the photosensitive polyimide resin film is formed at the upper part of re-wiring 9. Subsequently, the upper-most layer protection film 12 at the upper part of one end (bump land 9A) of re-wiring 9 is removed to expose the bump land 9A. Thereafter, as illustrated in FIG. 28, an Au plating layer 23 is formed with the non-electrolytic plating method to the surface of bump land 9A.

Figure 29:
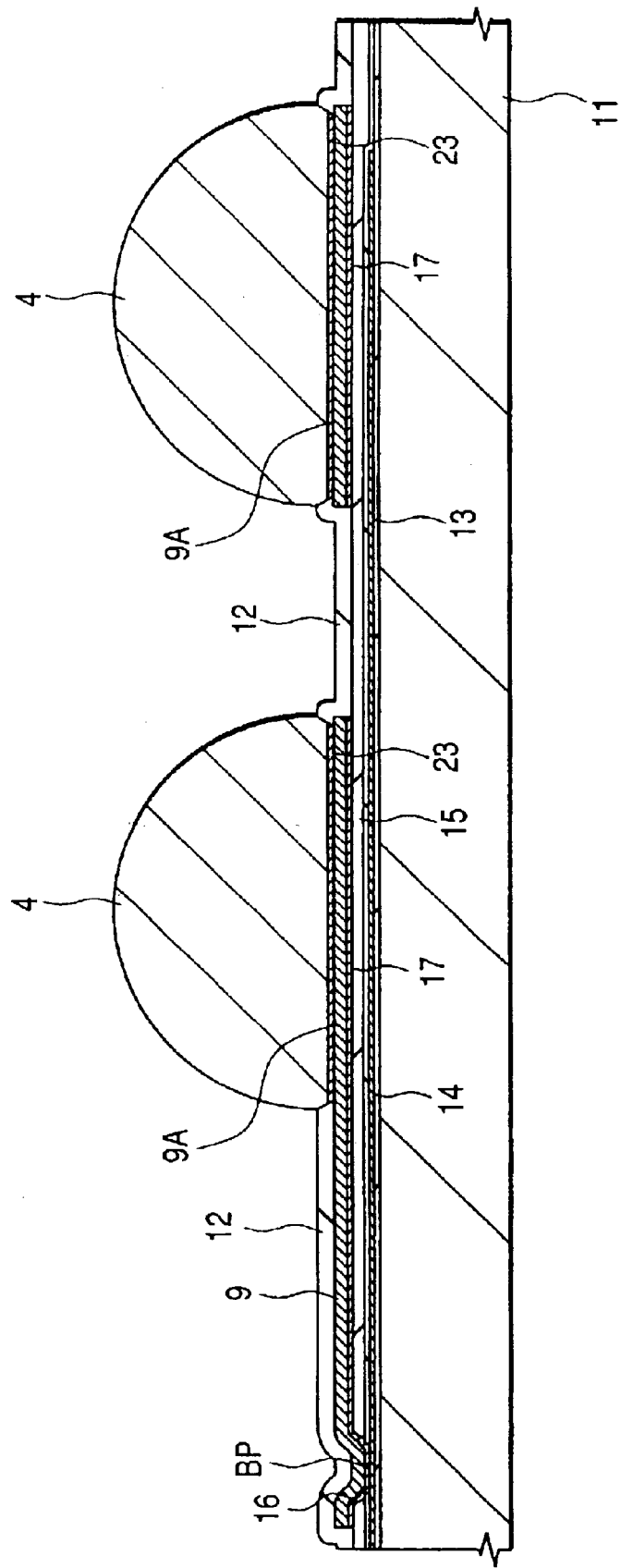
FIG. 29 is a cross-sectional view of the essential portion illustrating the manufacturing method of the memory chip.

Next, as illustrated in FIG. 29, a solder bump 4 is connected on the bump land 9A. The solder bump 4 is, for example, a Pb (lead)-free solder (fusing temperature=220☐ to 230☐) consisting of Sn (98.5%), Ag (1%) and Cu (0.5%) and its diameter is about 200 to 450 μm.

Figure 30:
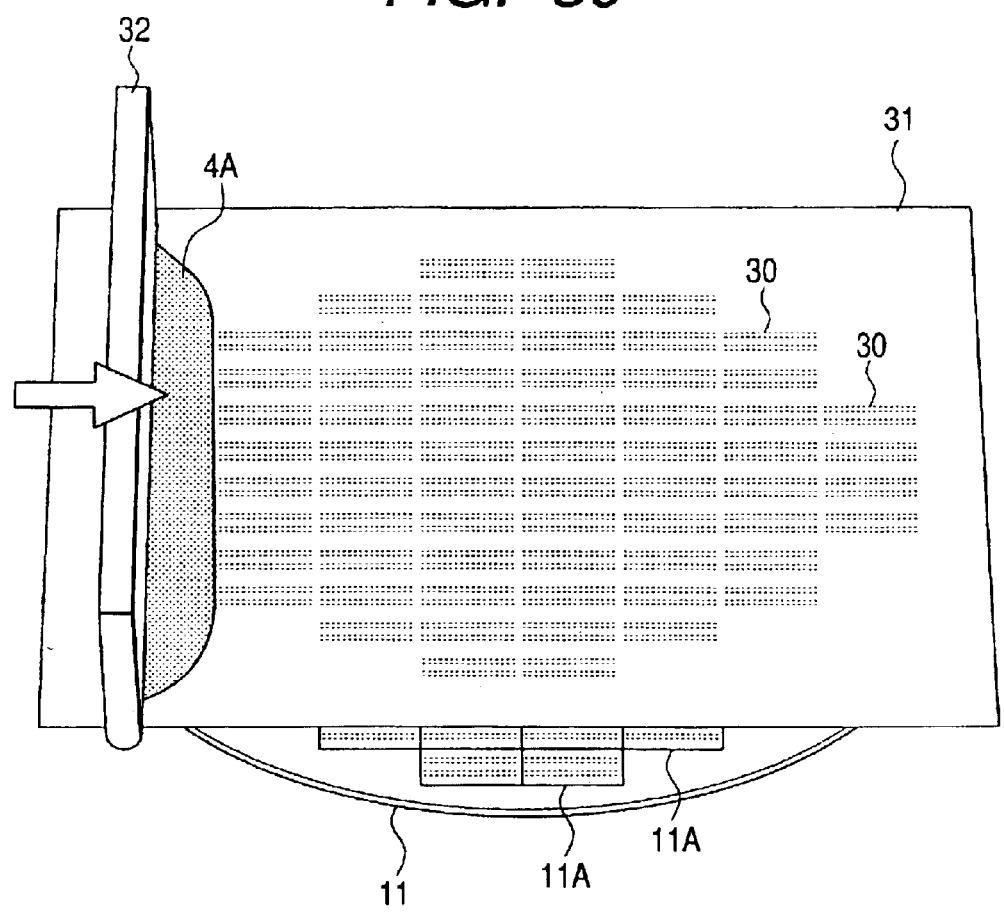
FIG. 30 is a perspective view illustrating the manufacturing method of the memory chip.

The solder bump 4 can be formed on the bump land 9A as explained below. A solder printing mask 31 on which a hole 30 is formed corresponding to the layout of the bump land 9A is overlapped on the wafer 11 through the alignment, for example, as illustrated in FIG. 30 and a solder paste 4A is printed on the surface of the bump land 9A with a squeegee 23. Thereafter, the wafer 11 is heated up to about 240☐ to reflow the solder paste 4A in order to form a spherical solder bump 4 as illustrated in FIG. 29. The solder bump 4 can also be formed with a plating method in place of the printing method. Moreover, it is also possible that a solder ball which is previously formed in the spherical shape is supplied on the bump land 9A and thereafter the wafer 11 is heated to reflow the solder ball as an external connecting terminal.

Figure 31:
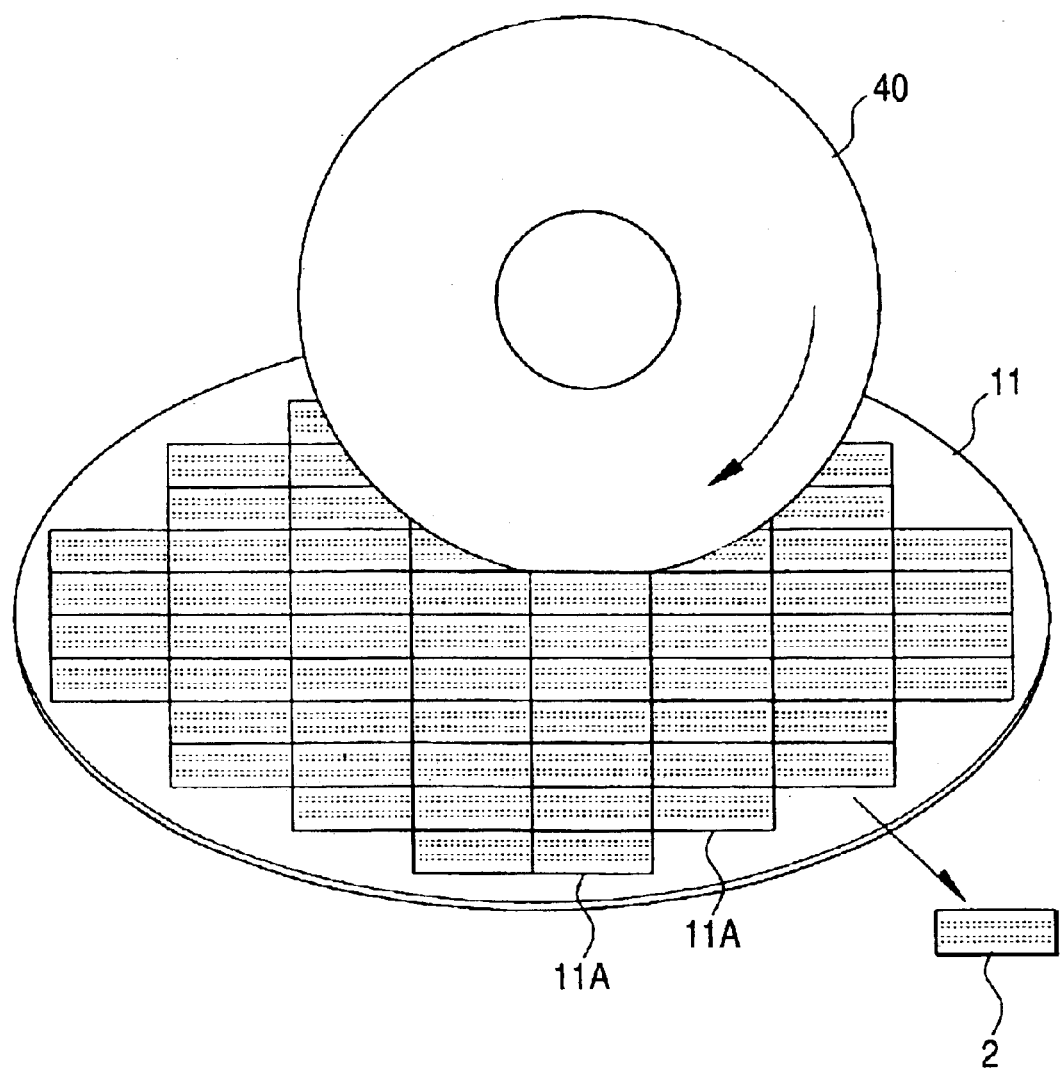
FIG. 31 is a perspective view illustrating the manufacturing method of the memory chip.

Thereafter the wafer 11 is subjected to the burn-in test to judge the condition of the chip area 11A and each chip area 11A of the wafer 11 is cut and separated to each memory chip piece 2 using a dicing blade 40 as illustrated in FIG. 31. Each memory chip 2 is subjected to the selection test to finally judge the condition thereof. This selection test includes a test to check the normal operation of memory chip 2 when the word configuration is 1M×64 bits or 2M×32 bits and a test to check the normal operation of memory chip 2 when the read system is set to the DDR mode or SD mode.

With the processes explained above, the memory chip 2 illustrated in FIG. 13 to FIG. 15 can be completed. Although the circuit configuration is different, the control chip 3 can also be manufactured with the method conforming to the method explained above.

The memory chip 2 and the control chip 3 manufactured with the method explained above can be mounted to the module substrates 1A and 1B as explained below. After a flux is printed on the pad 6A of the module substrates 1A, 1B, the solder bumps 4 formed on the respective main surfaces of memory chip 2 and control chip 3 are positioned on the pads 6A of module substrates 1A, 1B and the solder bumps 4 are reflown within a heating furnace. Next, a gap between the module substrates 1A, 1B and memory chip 2 and a gap between the module substrates 1A, 1B and control chip 3 are filled with the under-fill resin 5 and this under-fill resin 5 is hardened within the heating furnace.

Here, if the solder bump 4 is not connected to the bump land 9A corresponding to the open pins at the time of supplying the under-fill resin 5 to the gap between the module substrate 1B and the memory chip 2 after loading the memory chip 2 on the module substrate 1B of which word configuration is 2M×32 bits, wettability of the liquid under-fill resin 5 is lowered at the area near the open pins resulting in a fear for generation of voids. However, in this embodiment, since the solder bump 4 is also connected to the bump land 9A corresponding to the open pins not used, generation of voids can be prevented.

Next, after the solder bump 7 is connected at the rear surfaces of the module substrates 1A, 1B on which the memory chip 2 and control chip 3 are mounted, the selection test is conducted to discriminate the conditions of the module substrates 1A, 1B. Thereby, the multi-chip modules (MCM1, MCM2) can be completed.

As explained above, according to this embodiment, a plurality of kinds of multi-chip modules (MCM1, MCM2) having different functions of the word configuration and operation mode can be manufactured by loading the identical memory chip 2 (and the identical control chip 3) to a plurality of types of module substrates 1A, 1B prepared previously. Therefore, only a kind of memory chip 2 to be manufactured by the wafer process is required. Namely, according to this embodiment, it is no longer required to update the pattern of re-wiring 9 depending on the functions in the process to manufacture the memory chip 2 explained above.

(Embodiment 2)

Figure 32:
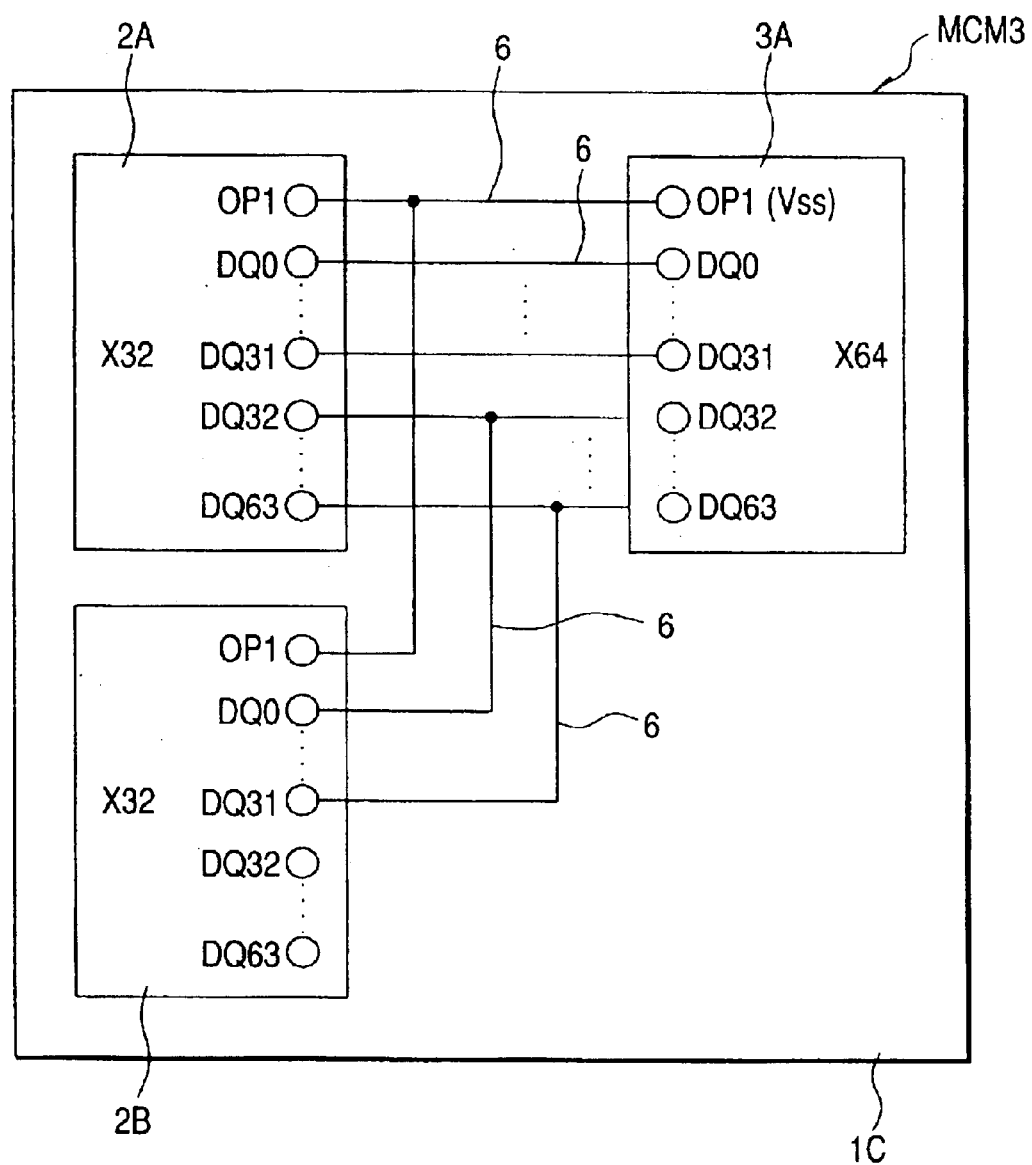
FIG. 32 is a plan view illustrating the first multi-chip module as the other embodiment of the present invention.

FIG. 32 is a schematic plan view of the first multi-chip module (MCM3) of this embodiment on which two memory chips (2A, 2B) and one control chip 3A are mounted with the face-down method to the main surface of a module substrate IC. Moreover, this figure illustrates the concept of the wiring 6 for connecting the data input/output pins DQ of two memory chips 2 (2A, 2B) and the data input/output pins DQ of one control chip 3A.

The two memory chips 2 (2A, 2B) mounted to the module substrate IC of the multi-chip module (MCM3) are identical to the memory chip 2 of the embodiment 1, namely the silicon chip on which the DRAM having the storage capacity of 64 M bits is formed. These memory chips 2 (2A, 2B) can select the word configuration of ×64 bits or ×32 bits depending on the condition that the voltage supplied to the option pin OP1 is the power supply voltage (Vdd) or the ground potential (Vss).

In the case of the multi-chip module (MCM3), the option pins OP1 of two memory chips 2 (2A, 2B) is connected to the option pin OP1 of the control chip 3A via the wiring 6 and the ground potential (Vss) is supplied from the control chip 3A. Namely, the word configurations of two memory chips 2 (2A, 2B) are respectively ×32 bits.

In the memory chip 2A among the two memory chips 2 (2A, 2B), the 32 data input/output pins DQ0 to DQ31 among the 64 data input/output pins DQ0 to DQ63 are connected to the data input/output pins DQ0 to DQ31 of the control chip 3A via the wiring 6 of the module substrate IC. Moreover, the remaining data input/output pins DQ32 to DQ63 are connected to the data input/output pins DQ32 to DQ63 of the control chip 3A via the wiring 6 of the module substrate IC. However, since the word configuration is ×32 bits, any data cannot be outputted from the data input/output pins DQ32 to DQ63.

On the other hand, in the memory chip 2B, the 32 data input/output pins DQ0 to DQ31 among the 64 data input/output pins DQ0 to DQ63 are connected to the data input/output pins DQ32 to DQ63 of the control chip 3A via the wiring 6 of the module substrate IC. Namely, in the case of memory chip 2B, the 32 bits data (DQ0 to DQ31) to be outputted is then inputted to the control chip 3A as the data (DQ32 to DQ63).

As explained above, the multi-chip module (MCM3) realizes the word configuration of ×64 bits using the two memory chips 2 (2A, 2B) having respectively the word configuration of ×32 bits.

Figure 33:
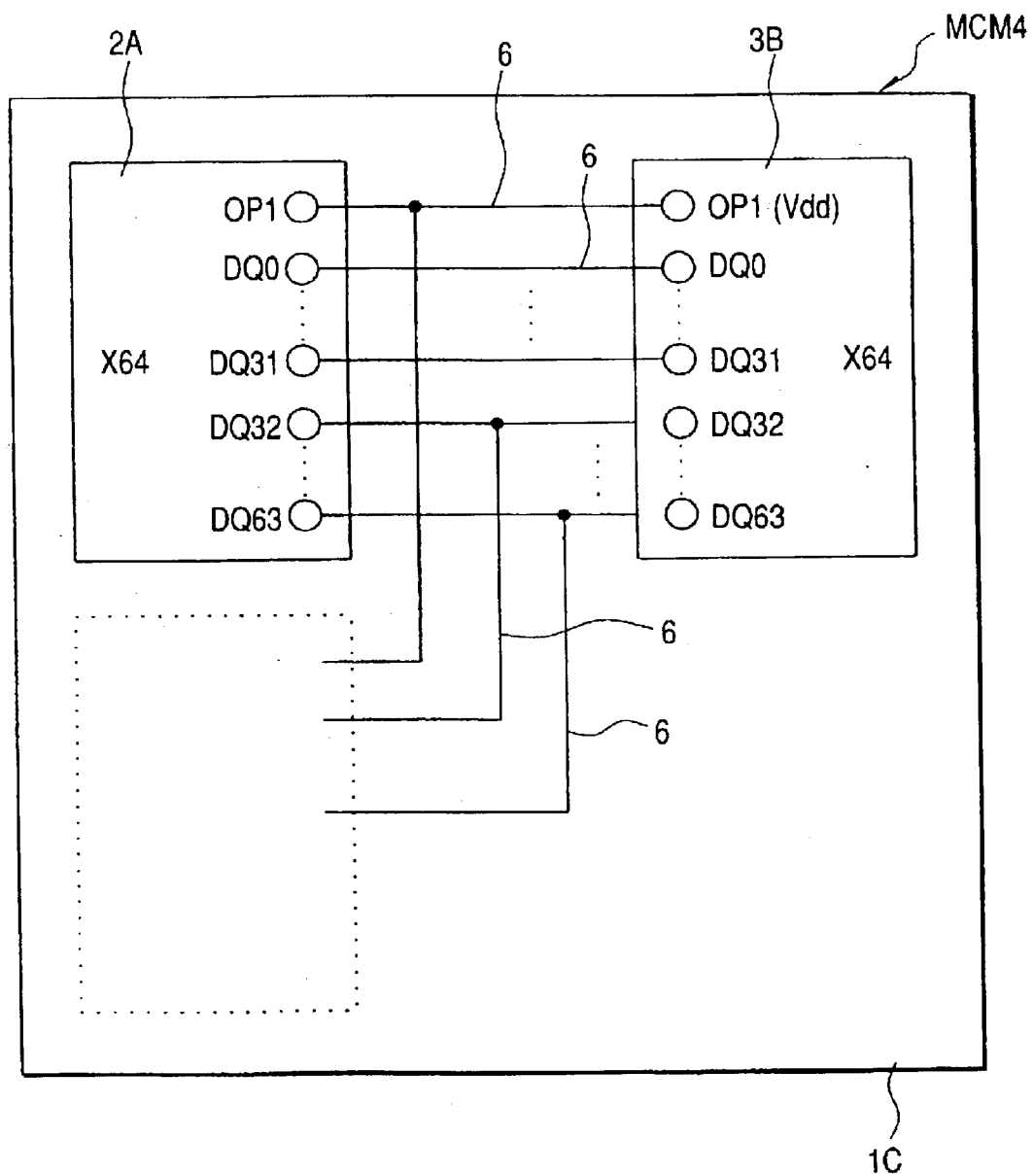
FIG. 33 is a plan view illustrating the second multi-chip module as the other embodiment of the present invention.

FIG. 33 is a schematic plan view of the second multi-chip module (MCM4) of this second embodiment on which one memory chip 2 and one control chip 3B are mounted with the face-down method on the main surface of the module substrate IC. Moreover, in this figure, the concept of the wiring 6 for connecting the data input/output pins DQ of memory chip 2 to the dada input/output pins DQ of control chip is illustrated.

The module substrate IC of this multi-chip module (MCM4) is identical to the module substrate IC of the first multi-chip module (MCM3). Moreover, one memory chip 2 mounted on the module substrate IC is mounted to the area where the memory chip 2A of the first multi-chip module (MCM3) is mounted. The option pin OP1 of this memory chip 2 is connected to the option pin OP1 of the control chip 3B via the wiring 6 and thereby the power supply voltage (Vdd) is supplied from the control chip 3B. Therefore, the word configuration of memory chip 2 becomes ×64 bits and the 64 data input/output pins DQ0 to DQ63 are respectively connected electrically to the corresponding data input/output pins DQ0 to DQ63 of the control chip 3B via the wiring 6 of the module substrate IC. Namely, the multi-chip module (MCM4) realizes the word configuration of ×64 bits using one memory chip 2 having the word configuration of ×64 bits.

The multi-chip module (MCM3) realizes the word configuration of ×64 bits using two memory chips 2 (2A, 2B) having respectively the word configuration of ×32 bits.

According to this embodiment, the memory capacity confirming to the memory capacity required by the control chips 3A, 3B can be realized, while the word configuration of ×64 bits is maintained, by manufacturing the two kinds of multi-chip modules MCM3 and MCM4 explained above.

As explained previously, in the present embodiment, a plurality of types of multi-chip modules (MCM3, MCM4) are manufactured by loading any one of the two kinds of control chips 3A, 3B of different voltage level outputted from the option pin OP1 to the module substrate IC and by loading one or two memory chips 2 on the module substrate IC. Accordingly, it is not required to change the pattern of re-wiring 9 for every function in the manufacturing step of the memory chip 2. Moreover, only one kind of module substrate IC is required.

In the case where two memory chips 2 (2A, 2B) respectively having the word configuration of ×32 bits are mounted to the module substrate IC, it is desirable, to prevent generation of voids within the under-fill resin 5 filling the gap between the memory chip 2 and module substrate IC, that the solder bump 4 is connected to the bump land (9A) corresponding to the open pins not used (data input/output pins DQ32 to DQ63).

The present invention has been explained practically based on the embodiments thereof, but the present invention is not limited to above embodiments and naturally allows various changes and modifications within the scope not departing from the claims thereof.

In the embodiment 1, two kinds of module substrates having changed the pattern of wiring connected to the option pin have been prepared as the method for changing a voltage level supplied to the option pin of the memory chip. However, it is also possible to prepare two kinds of mother boards having changed the pattern of wiring connected to the option pin via the module substrate. In this case, since it is enough to select a kind of mother board in the process to load the multi-chip module to the mother board, the functions can be changed after loading the memory chip to the module substrate.

In the embodiment 2, as a method of switching the voltage level to be supplied to the option pins of the memory chip, two kinds of control chip having changed the voltage level to be supplied to the option pins are prepared. However, it is also possible to prepare the control chip comprising a circuit to set the word configuration of the memory chip to ×64 bits and the control chip comprising a circuit to set the word configuration to ×32 bits. In this case, different kinds of control chip must be prepared for each function but it is enough when only one kind of module substrate is prepared.

Figure 34:
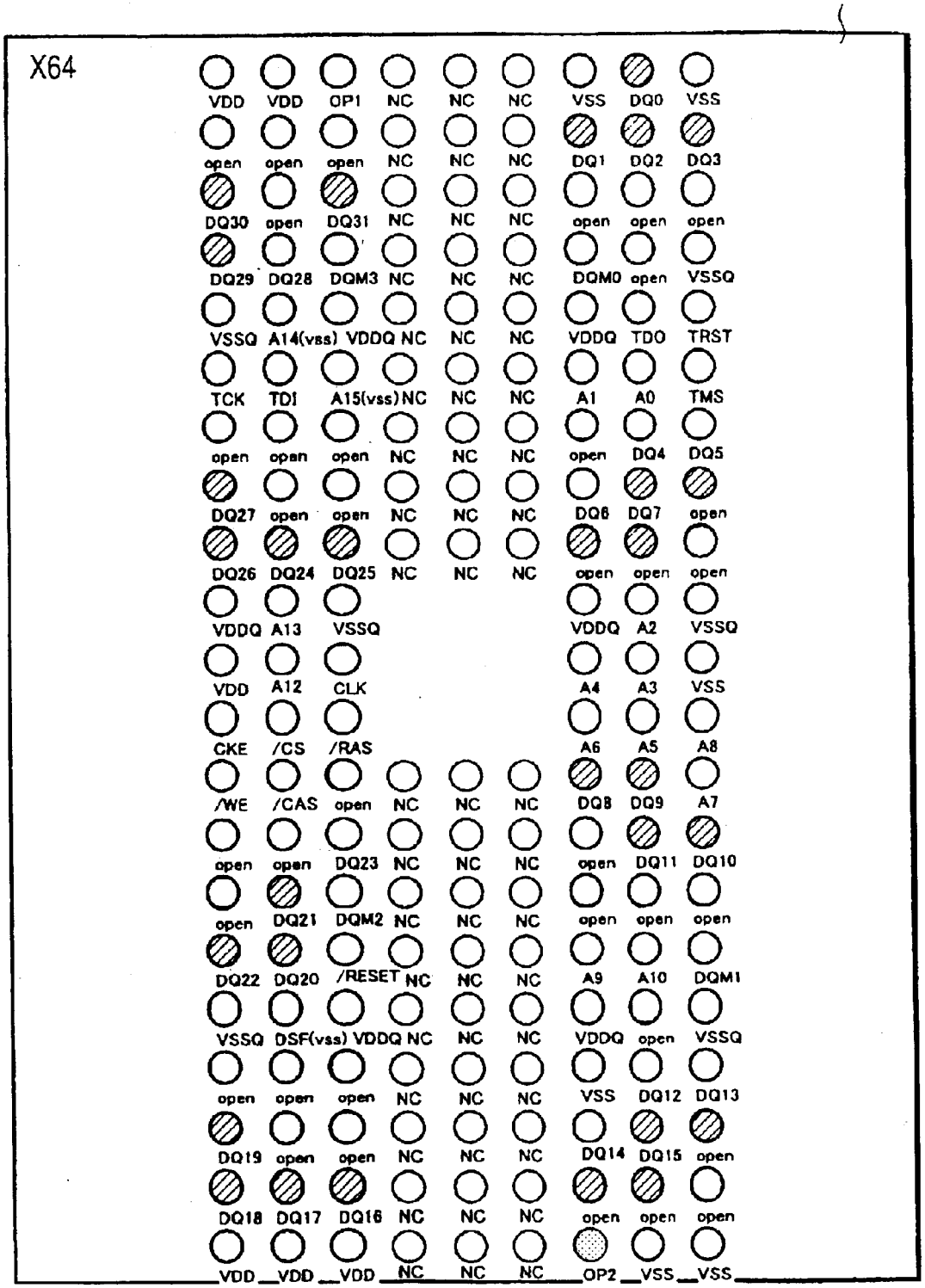
FIG. 34 is a plan view illustrating a layout of the pins of the memory chip.

Moreover, as illustrated in FIG. 34, the NC (Non-connect) pins are provided in some cases depending on the application field of the memory chip 2. In the case of wafer process package, only the bump land 9A is formed to the NC pins and a re-wiring 9 connecting the bonding pad PB and bump land 9A is not formed. Even in the case of using the memory chip 2 including the NC pins, reliability of multi-chip module can be improved because generation of voids in the under-fill resin 5 filling the gap between the memory chip and module substrate can be prevented by connecting the solder bump 4 to the bump land 9A of all pins including the NC pins.

Moreover, in the embodiment 1, manufacture of multi-chip modules of different word configuration and operation mode has been explained but this embodiment can also be applied to manufacture of a plurality of kinds of multi-chip modules of different functions other than that explained above, for example, a refresh cycle. Moreover, a memory chip is not limited to the DRAM and various memories such as SRAM and non-volatile memory can also be used.

The present invention can provide following excellent effect as explained below.

A plurality of kinds of multi-chip module can be realized using the identical memory chips by preparing the first wiring substrate for supplying the first voltage level signal to the external connecting terminal for switching the function of the memory chip and the second wiring substrate for supplying the second voltage level signal to the external connecting terminal for switching the function and then loading the memory chips to these two kinds of wiring substrate.

What is claimed is:

1. A semiconductor device of multi-chip module structure in which a plurality of semiconductor chips including memory chips are mounted on a wiring board, wherein said memory chip includes: an integrated circuit including a plurality of memory elements; a plurality of electrodes electrically connected to said integrated circuit; an insulation layer formed covering said integrated circuit and exposing said plurality of electrodes; a plurality of wirings formed at the upper part of said insulation layer and electrically connected respectively to said plurality of electrodes; and a plurality of external connecting terminals formed at the upper part of said insulation layer and electrically connected respectively to said plurality of wirings, and wherein said plurality of external connecting terminals include a function switching external connecting terminal for switching the predetermined functions of said integrated circuit depending on a voltage level of an input signal and switch a function to the predetermined function of said integrated circuit by supplying a signal of the predetermined voltage level to said function switching external connecting terminal of said memory chip through said wiring board.

2. A semiconductor device according to claim 1, wherein said wiring board is comprised of the first wiring board for supplying a signal of the first voltage level to said function switching external connecting terminal of said memory chip and the second wiring board for supplying a signal of the second voltage level to said function switching external connecting terminal of said memory chip, and switches a function to the predetermined function of said integrated circuit by loading said memory chip to any one of said first wiring board or said second wiring board.

3. A semiconductor device according to claim 2, wherein said first wiring board and said second wiring board are different from each other in the wiring patterns connected to said function switching external connecting terminal of said memory chip.

4. A semiconductor device according to claim 2, wherein the first semiconductor chip for supplying said signal of the first voltage level to said function switching external connecting terminal of said memory chip is mounted on said first wiring board and the second semiconductor chip for supplying said signal of the second voltage level to said function switching external connecting terminal of said memory chip is mounted on said second wiring board.

5. A semiconductor device according to claim 1, further comprising a loading substrate to load said wiring board, said loading substrate including: a first loading substrate for supplying a signal of the first voltage level to said function switching external connecting terminal of said memory chip via said wiring board, and a second loading substrate for supplying a signal of the second voltage level to said function switching external connecting terminal of said memory chip via said wiring board, a function of said integrated circuit being switched to the predetermined function by loading said wiring board to any one of said first loading substrate or to said second loading substrate.

6. A semiconductor device according to claim 5, wherein said first loading substrate and said second loading substrate are different from each other in the wiring pattern connected said function switching external connecting terminal of said memory chip via said wiring board.

7. A semiconductor device according to claim 1, wherein a bump electrode is connected to said external connecting terminal of said memory chip, and a gap between said memory chip and said wiring board is filled with a sealing resin.

8. A semiconductor device according to claim 7, wherein said external connecting terminal of said memory chip includes an open external connecting terminal which does not output a signal to said wiring board, and said bump electrode is connected to said open external connecting terminal.

9. A semiconductor device according to claim 7, wherein said external connecting terminal of said memory chip further includes an open external connecting terminal not electrically connected to said wiring, and said bump electrode is connected to said open external connecting terminal.

10. A semiconductor device according to claim 1, wherein said wiring is formed of a metal material which is mainly comprised of copper and said external connecting terminals are allocated in the form of an area array on the main surface of said memory chip.

11. A semiconductor device according to claim 1, wherein the predetermined functions of said integrated circuit include word configuration or operation mode.

12. A semiconductor device according to claim 1, wherein said memory chip is comprised of a silicon chip on which a DRAM is formed.

* * * * *